(12) United States Patent
Shibata

(10) Patent No.: US 7,663,730 B2
(45) Date of Patent: Feb. 16, 2010

(54) HEAT RADIATOR AND DISPLAY UNIT

(75) Inventor: Hirokazu Shibata, Tokyo (JP)

(73) Assignee: Sony Corporation, Tokyo (JP)

( * ) Notice: Subject to any disclaimer, the term of this patent is extended or adjusted under 35 U.S.C. 154(b) by 365 days.

(21) Appl. No.: 11/573,376

(22) PCT Filed: Aug. 15, 2005

(86) PCT No.: PCT/JP2005/014929

§ 371 (c)(1),
(2), (4) Date: Feb. 7, 2007

(87) PCT Pub. No.: WO2006/019085

PCT Pub. Date: Feb. 23, 2006

(65) Prior Publication Data

US 2007/0211205 A1      Sep. 13, 2007

(30) Foreign Application Priority Data

Aug. 18, 2004    (JP)    ............................ 2004-238797

(51) Int. Cl.
*G02F 1/1333*    (2006.01)
(52) U.S. Cl. ..................................... 349/161
(58) Field of Classification Search ....................... None
See application file for complete search history.

(56) References Cited

U.S. PATENT DOCUMENTS 5,721,602  A  *  2/1998  Narayan et al. ............. 349/161
6,439,731  B1 *  8/2002  Johnson et al. ............... 362/29
6,693,682  B2 *  2/2004  Fujishiro et al. .............. 349/65
2008/0316750 A1 * 12/2008  Park ........................... 362/294

FOREIGN PATENT DOCUMENTS

| EP | 1 143 288 | 10/2001 |
|---|---|---|
| JP | 62-196878 | 8/1987 |
| JP | 08-116096 | 5/1996 |
| JP | 10-123512 | 5/1998 |
| JP | 11-064849 | 3/1999 |
| WO | 00/60406 | 10/2000 |

OTHER PUBLICATIONS

European Search Report issued on Feb. 26, 2008 in connection with corresponding European Patent Application No. 05780229.0.

\* cited by examiner

*Primary Examiner*—Sung H Pak
(74) *Attorney, Agent, or Firm*—Sonnenschein Nath & Rosenthal LLP

(57) ABSTRACT

Disclosed is a heat radiator which is provided in a transmissive display unit in which a plurality of rows of light emitting arrays constituted by arranging a plurality of light emitting units including a plurality of LEDs mounted on a wiring substrate are arranged on the back surface side of a transmissive display panel, and illuminating light emitted from the LEDs is irradiated onto the display panel. In the heat radiator, a radiation plate (28) supporting LEDs (18) and a heat sink (37) constitute an overlap area (57) with a back panel (13) interposed therebetween and are integrated with each other through the back panel by a fixing member in the overlap area. The back panel, radiation plate, and heat sink are firmly mounted to each other, achieving effective heat radiation.

2 Claims, 12 Drawing Sheets

HEAT RADIATOR AND DISPLAY UNIT

TECHNICAL FIELD

The present invention relates to a heat radiator that effectively radiates heat generated in association with lighting operation of a transmissive display unit which is obtained by mounting a backlight unit to the back side of a transmissive display panel such as an LC (liquid crystal) panel, the backlight unit having a large number of light emitting diodes and irradiating the transmissive display panel with illumination light emitted from the light emitting diodes, and lighting operation of the light emitting diodes.

This application is based upon and claims the benefit of priority from prior Japanese Patent Application No. 2004-238797, filed Aug. 18, 2004, the entire contents of which are incorporated herein by reference.

BACKGROUND ART

Comparing to a display unit using a CRT (Cathode-Ray tube), an LCD (Liquid Crystal Display) unit is advantageous in that its display screen has been made larger, lighter, and thinner and the power consumption thereof has been reduced. Thus, along with a self-emission type PDP (Plasma Display Panel) or the like, the liquid crystal display unit has frequently been used for a television set or various types of display units. The liquid crystal display unit has a liquid crystal panel which encapsulates liquid crystal between two transparent substrates of various sizes and applies a voltage between electrodes provided on the transparent substrates to change the orientation of liquid crystal molecules to thereby change light transmittance, optically displaying a given image or the like.

Since the liquid crystal itself is not a self-emissive material, the liquid crystal display unit includes a light source section for supplying illumination light to the liquid crystal panel. As the light source section, a sidelight system that irradiates the liquid crystal panel with illumination light from the side position of the panel back surface or a backlight system that directly irradiates the back surface of the liquid crystal panel is typically adopted. The backlight unit has, e.g., a light source, a light guide plate for guiding illumination light to the liquid crystal panel, a reflection sheet, and a lens sheet or diffusion sheet. Using the above optical plates, the backlight unit uniforms the illumination light so as to irradiate the entire surface of the liquid crystal panel with the uniformed illumination light.

Conventionally, as a light source of the backlight unit, a CCLF (Cold Cathode Fluorescent Lamp) which encapsulates mercury, xenon, or the like in a fluorescent tube has been used.

Such a backlight unit has some problems to be solved, with regard to the CCLF. That is, the CCLF cannot provide satisfactory emission brightness; the life of the CCLF is comparatively short; brightness uniformity cannot be secured in the CCLF due to generation of low brightness area on the cathode side thereof; and the like.

A large-sized liquid crystal display unit is typically provided with an area litconfiguration backlight unit having a plurality of long CCLFs disposed on the back side of a diffusion plate for uniforming illumination light emitted from a light source so as to irradiate a liquid crystal panel with the illumination light. Also in this area litconfiguration backlight, solution of the abovementioned problems that the CCLF has is required. Especially, in a large-sized television set of 30 inches or more, problems in terms of brightness level and brightness uniformity have become more prominent.

On the other hand, in the field of the area litconfiguration backlight unit, an LED (Light Emitting Diode) area litconfiguration backlight having, as a light source, a large number of red, green, and blue LEDs arranged on the back surface side of a diffusion film in a two dimensional manner so as to obtain white light has gotten a lot of attention in place of the abovementioned CCLF. In such a LED backlight unit, cost reduction is achieved along with reduced cost of the LED, and high brightness image or the like can be displayed on its large-sized liquid crystal panel with low power consumption.

In a liquid crystal display unit, a large amount of heat is generated from a large number of LEDs provided in the LED backlight unit. An enclosed space of the liquid crystal display unit is formed by close contact between the LED backlight unit and the back surface side of a liquid crystal panel, so that heat from the respective LEDs is accumulated in the enclosed space to produce high-temperature state. As a result, the respective LEDs themselves are heated and thereby their emission characteristics are changed. Accordingly, a change occurs in the color of the light emitted from the LEDs to generate color irregularity or brightness irregularity in the light emitted from the LED backlight unit.

Further, there is a fear that heat generated from the LEDs is accumulated in the enclosed space formed on the back surface side of the liquid crystal panel to deform or transform optical plates. There is also a fear that electronic components or integrated circuit elements are affected by heat to result in unstable operation.

To solve the above disadvantages, the liquid crystal display unit is provided with a heat radiator that effectively radiates heat generated from the respective LEDs provided in the LED backlight unit. A cooling fan is used as this kind of heat radiator. This cooling fan is used to directly blow cooling air over the LEDs of the LED backlight unit to achieve heat radiation. However, the use of such a cooling fan allows dust included in the cooling air sucked from outside the unit to be adhere to the surfaces of the LEDs, thereby deteriorating the emission characteristics of the light emitted from the LEDs.

In order to cope with this problem, a heat radiator configured to perform heat radiation while conducting heat generated from the LEDs from the enclosed space to a heat sink through an appropriate heat conducting member has been proposed. The heat sink is formed by a lightweight metal material having a high heat conductivity, such as aluminum, and is constituted by a plate-like base to be mounted to, e.g., a frame and a large number of fins integrally formed by raising up a part of the surface of the base which faces to the mounting surface thereof and arranged at predetermined intervals from one another. Since the heat conducting member blocks illumination light, such a heat radiator cannot directly be disposed within the enclosed space.

Another type of heat radiator has also been proposed, in which, for example, a wiring substrate on which a large number of LEDs are mounted is mounted to a heat radiation plate which is to be fixed to a back plate, and a heat sink is mounted to the back surface side of the back plate. In this heat radiator, heat from the respective LEDs is conducted to the heat sink through the heat radiation plate and back plate to thereby achieve heat radiation. In addition, a heat radiator having a cooling fan mounted to a heat sink and providing cooling air between respective fins of the heat sink or discharging internal air from between the respective fins to perform effective heat radiation has been proposed.

In order to achieve satisfactory heat conduction between the radiation plate and back plate and between radiation plate and heat sink in a heat radiator, these members need to be coupled to each other in an adhesive manner. The radiation plate or back plate is formed into a flat plate-like shape and thereby can achieve comparatively highly accurate coupling. For example, by combining a high efficiency heat conducting member such as a heat pipe or the like with the radiation plate, more satisfactory heat conduction can be realized.

On the other hand, the heat sink is formed by extruding an aluminum material and is constituted by, as described above, a base serving as a fixing portion to the back plate and a large number of fins integrally formed by raising up a part of one surface of the base. Although the base of the heat sink is comparatively thinly formed in general in order to achieve a reduced thickness and effective conduction of heat to the respective fins, a sufficient mechanical strength can be guaranteed since the respective fins are formed over the entire length of the base. A plurality of fins are integrally formed by the raising processing on the surface of the base, so that the thickness of the heat sink in the width direction is largely changed to generate warpage due to influence of processing accuracy or heat expansion. This makes it difficult to achieve adhesion between the base and back plate throughout the entire surfaces thereof to generate a gap therebetween, thereby deteriorating heat conduction efficiency.

The LED backlight unit is mounted to the inner surface of the back plate so as to face to the liquid crystal panel. The heat sink is mounted to the outside surface of the back plate. In order to reduce weight, thickness, and material cost while attempting to increase processing accuracy and production efficiency, the thickness of the back plate has been reduced in the liquid crystal display unit. This back plate constitutes a mounting member between the heat radiation plate and heat sink together with other various components, as described above.

In order to achieve adhesion between the entire surfaces of the heat radiation plate and heat sink which is comparatively large and heavy and is subject to warpage to guarantee the mechanical strength thereof to thereby increase heat conductivity, fixing members such as screws are used to tightly mount the radiation plate and heat sink. In this case, since each component is slightly warped, deformation occurs in a mounting portion of the back plate whose thickness has been reduced to impair the adhesion between the heat radiation plate and back plate and between the heat radiation plate and heat sink. It follows that heat conduction efficiency is reduced, failing to perform effective heat radiation. Further, provision of the mounting portions to the radiation plate and heat sink on the back plate reduces the mechanical strength of the back plate and increases man-hours to screw up. Further, intervention of the back plate between the heat radiation plate and heat sink impairs mechanical fixation between the heat radiation plate and heat sink as well as impairs heat conductivity therebetween.

DISCLOSURE OF INVENTION

It is desirable to provide a heat radiator capable of eliminating the above problems relating to a conventional art and a display unit using the heat radiator.

It is also desirable to provide a heat radiator capable of effectively radiating heat generated from an LED while reducing the thickness of the back plate and a display unit using the heat radiator.

A heat radiator according to the present invention is provided in a transmissive display unit in which a plurality of rows of light emitting arrays constituted by arranging a plurality of light emitting units including a plurality of light emitting diodes mounted on a wiring substrate are arranged on a back surface portion of a transmissive display panel, and for illuminating light emitted from the light emitting diodes to the display panel. The heat radiator includes a radiation plate, a back panel, and a heat sink. The radiation plate is formed by a metal material having heat conductance and is configured to support each wiring substrate on a first surface thereof to constitute the light emitting unit. The back panel is formed by a metal material having heat conductance and on a first surface of which the display panel is mounted so as to face the display panel by fixing a second surface of the radiation plate. The heat sink is formed by a metal material having heat conductance, and includes a base and a plurality of fins integrally formed at predetermined intervals on a first surface of the base. The heat sink is mounted to a second surface of the back panel using a second surface of the base as a mounting surface, and radiates heat from each of the fins by conducting heat generated by a lighting operation of the light emitting diodes according to heat conduction means.

The heat sink is disposed facing to a portion of the radiation plate through the back panel to constitute an overlap portion, where a plurality of mounting holes are formed in each of the radiation plate, back panel, and heat sink as to communicate with each other, and the radiation plate and heat sink are integrated with each other through the back panel by fixing members inserted in the mounting holes, thereby enhancing heat conductivity between the radiation plate and heat sink.

Heat generated by the lighting operation of the LEDs is conducted through the radiation plate to the back panel, and then conducted from the back panel to the heat sink, where the heat is radiated from the fins. The back panel having a small thickness is integrated with the radiation plate and heat sink by being sandwiched between them, thereby maintaining tight mounting between them, resulting in effective radiation of the heat generated in the LEDs. Therefore, in the hear radiator, uniform temperature distribution can be achieved over the entire surface of the transmissive display panel or other optical plates, thereby preventing occurrence of color irregularities and allowing respective components to stably operate.

By using the present invention, it is possible to reduce the thickness of the back panel, as well as to maintain tight mounting between the radiation plate, back plate, and heat sink that constitute a heat conduction path for radiating heat generated in the LEDs, to achieve effective heat radiation from the heat sink, to achieve stable light emission of LEDs, to prevent occurrence of color irregularities on the display panel, and to improve brightness and uniformity ratio. Further, by reducing the thickness of the back panel, it is possible to reduce the material cost and assembly man-hour.

The above and other objects, advantages and features of the present invention will be more apparent from the following description taken in conjunction with the accompanying drawings.

BEST MODE FOR CARRYING OUT THE INVENTION

An embodiment of a transmissive liquid crystal color display unit (hereinafter referred to as LCD unit) according to the present invention will be described below in detail with reference to the accompanying drawings.

Figure 1:
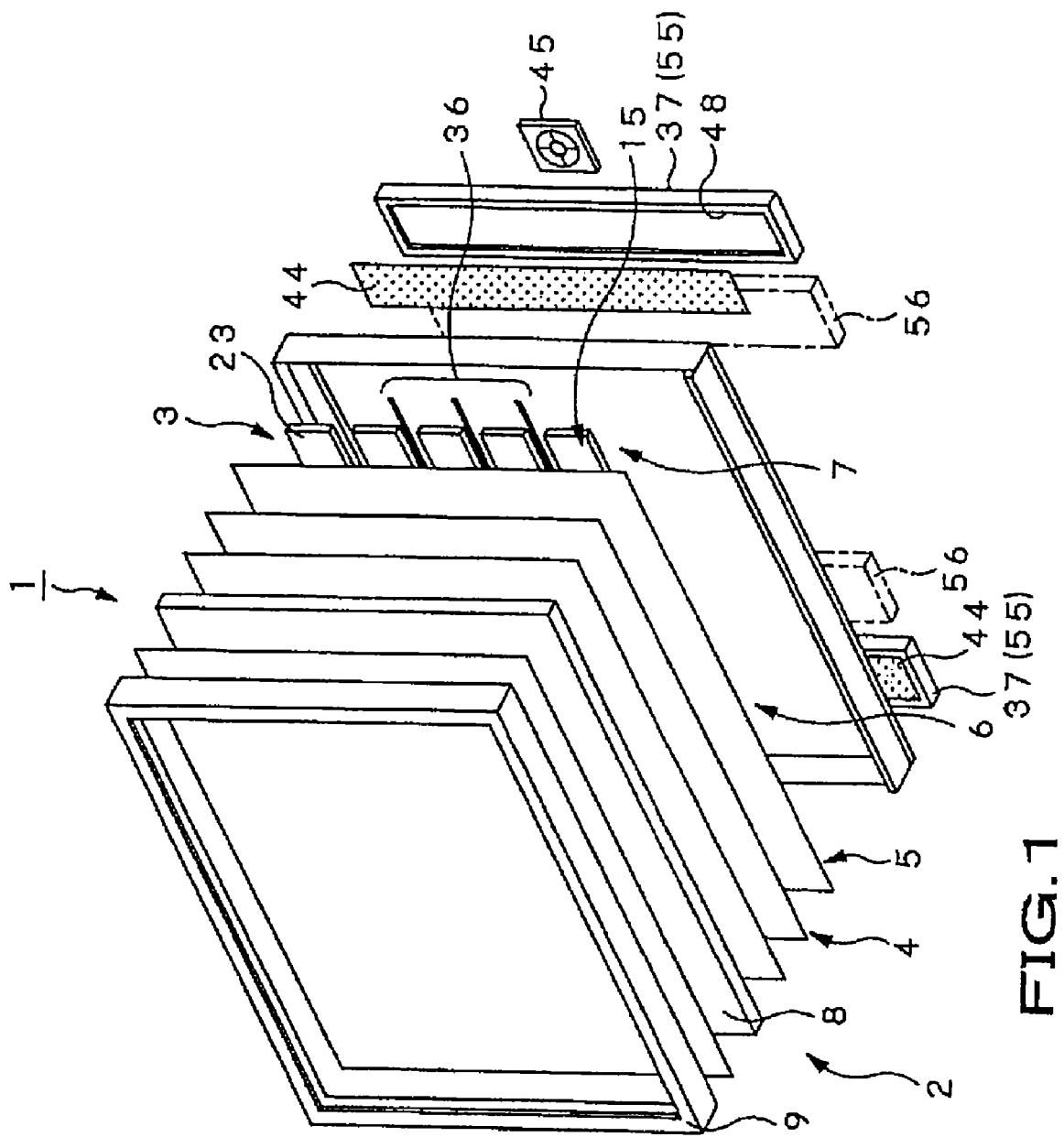
FIG. 1 is an exploded perspective view showing an embodiment of a transmissive liquid crystal display unit according to the present invention.
Figure 2:
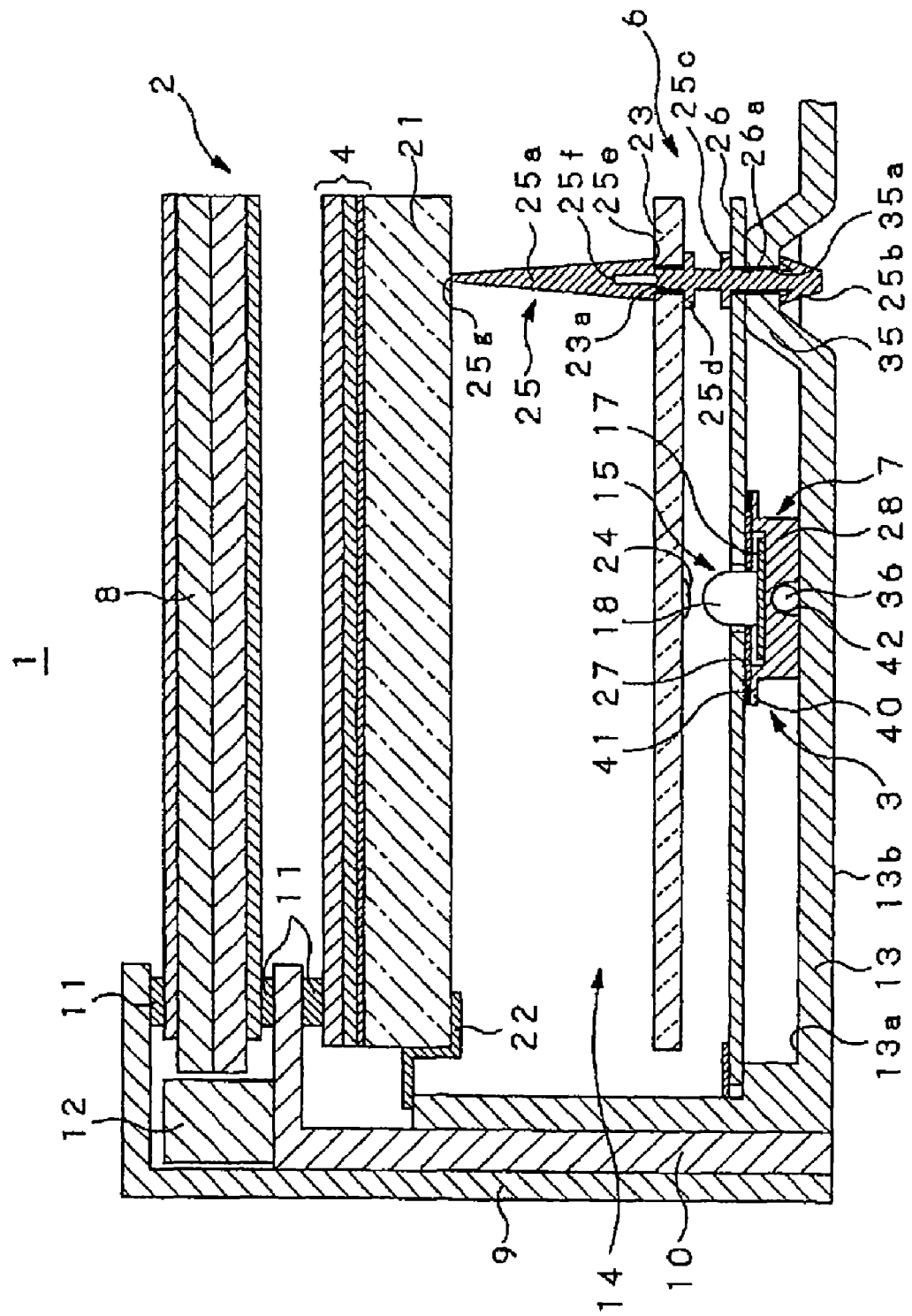
FIG. 2 is a vertical cross sectional view showing the main part of the transmissive liquid crystal display unit.

A liquid crystal display unit 1 according to the embodiment is used for a television set having a large-sized screen of, e.g., 40 inches or more, a display monitor unit, or the like. As shown in FIGS. 1 and 2, the liquid crystal display unit 1 includes a liquid crystal panel unit 2 and a backlight 3 which is mounted to the back surface side of the liquid crystal panel unit 2 and emits a large amount of illumination light. Between the liquid crystal panel unit 2 and backlight 3, an optical conversion section 4, a light guide panel 5, a reflection section 6, and a heat radiation section 7 are disposed. The optical conversion section 4 applies predetermined optical conversion to illumination light emitted from the backlight 3 so as to allow the converted light to enter the liquid crystal panel unit 2. The light guide panel 5 uniforms the illumination light so as to allow the uniformed light to enter the liquid crystal panel unit 2. The reflection section 6 reflects the illumination light which is emitted to the surrounding from the backlight 3 toward the light guide panel 5. The heat radiation section 7 radiates heat generated in the backlight 3.

The liquid crystal panel unit 2 has a liquid crystal panel 8 having a large display screen size of 30 inches or more. As shown in FIG. 2, the liquid crystal panel 8 is supported in such a manner that the outer periphery thereof is sandwiched between a frame-shaped front frame member 9 and a frame-shaped holder frame member 10 through a spacer 11, guide member 12, and the like. The holder frame member 10 and a back panel 13 (detail of which will be described later) constitute a chassis member to which respective constructional members are mounted and are fixed to the mounting portion with respect to a not shown casing. Although not shown, a cover glass is mounted to the front surface side of the liquid crystal panel 8.

Although the details are omitted here, being held in position with respect to other members by spacer beads or the like, the liquid crystal panel 8 encapsulates liquid crystal between a first glass substrate on which, e.g., a transparent segment electrode is formed and a second glass electrode on which a transparent common electrode is formed and changes the orientation of the liquid crystal molecules by an electric field generated by application of a voltage between the electrodes formed on the respective glass substrate to thereby change light transmittance. A stripe-shaped transparent electrode, an insulating film, and an alignment film are formed on the inner surface of the first glass substrate. A three primary color filter, an overcoat layer, a stripe-shaped transparent electrode, and an alignment film are formed on the inner surface of the second glass substrate. Polarizing and phase difference films are attached to the surfaces of both the first and second glass substrates. Further, in the liquid crystal panel 8, alignment films made of polyimide are arranged in the horizontal direction, forming interface with the liquid crystal molecules. The polarizing and phase difference films make the wavelength characteristics of the light achromatic, white, and color filter allows full-color image to be displayed.

Note that a configuration of the liquid crystal panel 8 according to the present invention is not limited to that described above but various types of known liquid crystal panels may be employed.

Figure 3:
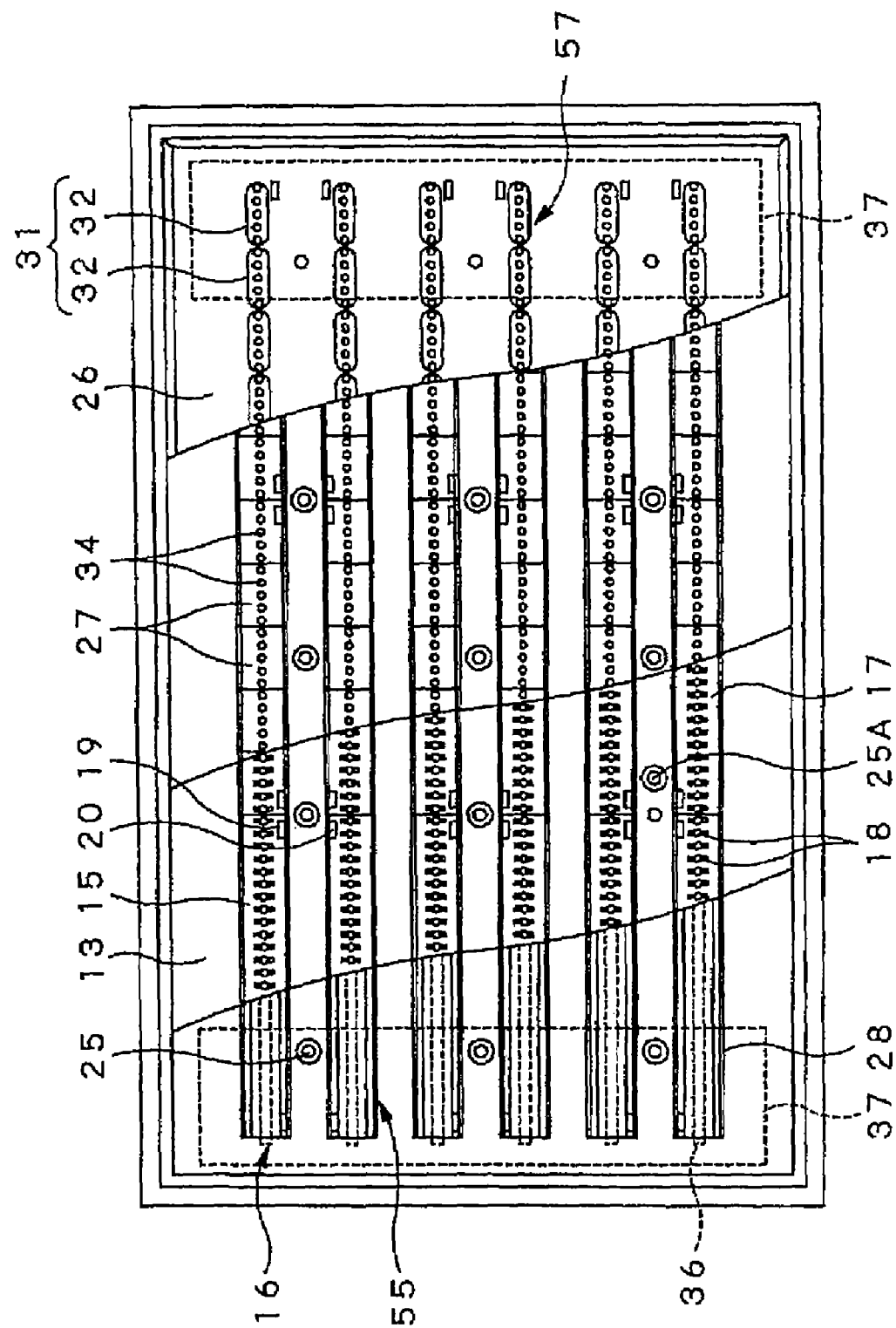
FIG. 3 is a partly cut plan view showing a light guide section, a backlight unit, and a reflection section.

As shown in FIG. 2, the backlight 3 is mounted to the back surface side of the abovementioned liquid crystal panel unit 2. The backlight 3 is so disposed as to face to the entire surface of the liquid crystal panel unit 2 and constitutes an optically-enclosed light guide space 14 together with the liquid crystal panel unit 2. Various types of backlights 3 may be employed in the present invention. For example, a predetermined number of light emitting units 15 are arranged on the same axis line to form a light emitting array 16, and a plurality of lines of the light emitting arrays 16 are arranged in parallel at predetermined intervals from one another. In the present embodiment, as shown in FIG. 3, three light emitting units 15 are arranged in a line in the length direction to thereby form one line of light emitting array 16, and six lines of light emitting arrays 16 are arranged in parallel in the vertical direction to thereby form the backlight 3. That is, the backlight 3 is constituted by 3 (light emitting units)×6 (light emitting arrays)=18 light emitting units 15.

The configuration of the backlight 3 according to the present invention is not limited to the above example but various types of the backlights may be used depending on the size and specification of a liquid crystal display unit in which they are to be provided.

Each of the light emitting units 15 that constitute the backlight 3 includes, as shown in FIG. 2, a wiring substrate 17, a plurality of LEDs 18 mounted on the wiring substrate 17, an input connector 19, and an output connector 20. The total number of 25 LEDs 18, incorporating red LEDs, green LEDs and blue LEDs, are mounted on the wiring substrate 17 of each light emitting unit 15 in such a manner that they are arranged in series on the same axis line. Therefore, 25 (LEDs)×3 (light emitting units)=75 LEDs 18 are provided for each light emitting array 16, and a total of 75 (LEDs)×6 (light emitting arrays)=450 LEDs 18 are provided in the backlight 3.

It goes without saying that the arrangement of the respective components in the backlight is not limited to the above example.

Figure 5:
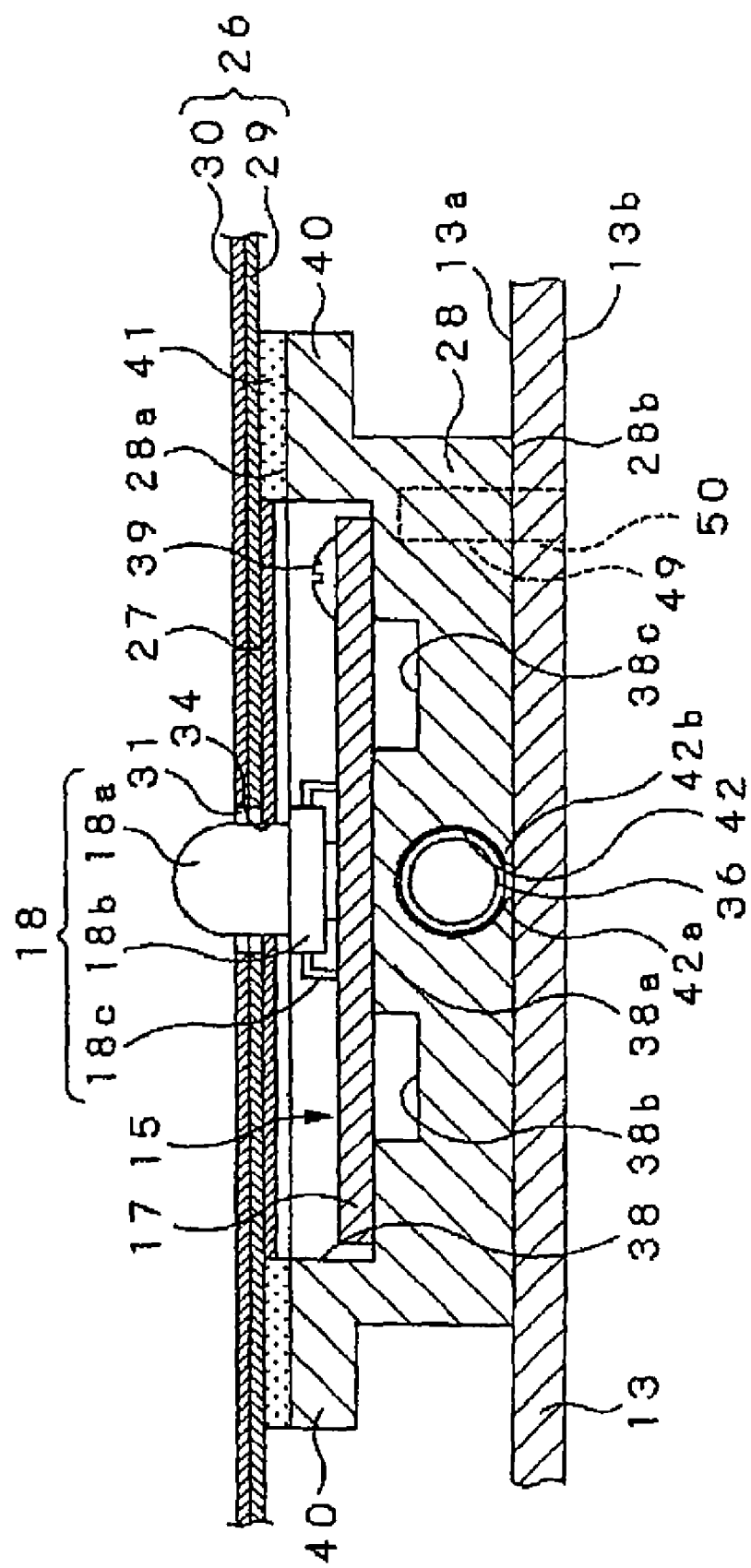
FIG. 5 is a vertical cross-sectional view showing the main part of a light emitting unit to be mounted to a back panel.

As shown in FIGS. 2 and 5, each LED 18 includes a light emitting section 18a, a resin holder 18b, and a pair of terminals 18c. The light emitting section 18a is supported by the resin holder 18b. The terminals 18c are drawn from the resin holder 18b. Although the details are omitted here, so-called a side emission type LED having directivity that allows the main component of emitted light to travel toward the outer circumference of the light emitting section 18a is used as the LED 18. In the backlight 3, the number of the light emitting units 15 and the number and arrangement interval of the LEDs 18 to be mounted on the light emitting unit 15 are determined based on the size of the liquid crystal panel 8 or the emission capability of each LED 18.

All the wiring substrates 17 of the light emitting units 15 are formed according to the same specification. Although not shown, a wiring pattern that connects the LEDs 18 in series and a land that connects the terminals of the LEDs 18 are formed on each wiring substrate 17. Each wiring substrate 17 has the input connector 19 and output connector 20 which are disposed on the same side in the width direction but disposed on the opposite sides in the longitudinal direction.

As shown in FIG. 3, the wiring substrates 17 of the light emitting units 15 that constitute one raw of a light emitting array 16 are arranged in the same direction. In each of the odd-numbered rows of light emitting array 16, i.e., first, third, and fifth rows of light emitting array, the light emitting units 15 are arranged such that the input and output connectors 19 and 20 are positioned at the lower side of the each wiring substrate 17. On the other hand, in each of the even-numbered rows of light emitting array 16, i.e., second, fourth, and sixth rows of light emitting array, the light emitting units 15 are arranged such that the input and output connectors 19 and 20 are positioned at the upper side of the each wiring substrate 17.

That is, in each of the light emitting arrays 16, the light emitting units 15 are arranged such that the input connector 19 provided on one wiring substrate 17 and output connector 20 provided on the adjacent wiring substrate 17 face each other in an identical row. Further, as for the vertical position, the light emitting arrays 16 are arranged such that the input connector 19 and output connector 20 provided on the wiring substrates 17 of the two facing light emitting units 15 disposed respectively in the odd-numbered row and even-numbered row face each other.

In each of the light emitting array 16, the light emitting units 15 are connected in series by a not shown lead wire with connector in an identical row. Since the input connector 19 and output connector 20 faces each other as described above, wiring between the light emitting units 15 can be achieved via the shortest route. In the odd-numbered rows of light emitting array 16, the input connectors 19 are positioned at the right side ends of the light emitting units 15 disposed on the right side of one light emitting unit 15, and output connectors 20 are positioned at the left side ends of the light emitting units 15 disposed on the left side of one light emitting unit 15. In the even-numbered rows of light emitting array 16, the output connectors 20 are positioned at the right side ends of the light emitting units 15 disposed on the left side of one light emitting unit 15, and input connectors 19 are positioned at the left side ends of the light emitting units 15 disposed on the right side of one light emitting unit 15. In the light emitting arrays 16, a longitudinal space defined between the odd-numbered row and even-numbered row is used to arrange the lead wires. Draw-in or draw-out of the lead wires to/from the space is made through a drawing opening (not shown) formed in the back panel 13. The lead wires that has been thus drawn-in or drawn-out are bundled by a clamper.

The lead wires are thus held and guided by utilizing a space defined between the light emitting arrays 16, thereby improving space efficiency and simplifying a wiring process. A mistake in assembling the light emitting units 15 in each of the light emitting arrays 16 or between the light emitting arrays is detected by the positions of the input and output connectors 19 and 20 mounted on the respective wiring substrate 17. The simplification of the wiring structure and wiring process and sharing of the lead wires between the wiring substrates 17 are achieved in each of the light emitting arrays 16.

In the liquid crystal display unit 1, a large amount of illuminating light generated by light emission of the LEDs 18 of the backlight 3 enters the liquid crystal panel 8 through the optical conversion section 4. The optical conversion section 4 has an optical sheet stacked body in which a plurality of optical sheets each having substantially the same outer shape as that of the liquid crystal panel 8 have been stacked. Specifically, the optical sheet stacked body includes a plurality of optical function sheets having various optical functions, such as an optical function sheet that converts illuminating light emitted from the backlight 3 into a perpendicular polarization component, an optical sheet that compensates the phase difference of the illuminating light to achieve wide view angle and prevention of coloration, or an optical function sheet that diffuses the illuminating light.

As shown in FIG. 2, the optical function sheet stacked body is mounted to the main surface of a diffusion light guide plate 21 (to be described later) of the light guide panel 5 and is disposed on the back side of the liquid crystal panel 8 through a support bracket member 22 mounted to the back panel 13 with a predetermined interval relative to the liquid crystal panel 8. The optical conversion section 4 is not limited to the abovementioned optical function sheet stacked body but other optical functional sheets such as a brightness enhancement film for enhancing the brightness, a phase difference film, or a pair of two upper and lower diffusion sheets sandwiching a prism sheet therebetween may be employed.

In the liquid crystal display unit 1, illuminating light emitted from the backlight 3 is uniformed by the light guide panel 5 throughout the surface thereof, guided in the light guide space 14, and enters the liquid crystal panel 8 through the optical conversion section 4. The light guide panel 5 includes a diffusion light guide plate 21 and a diffusion plate 23 which are positioned in the light guide space 14 and are spaced apart from each other by a predetermined distance by an optical stud member 25 to be described later.

The diffusion light guide plate 21 is a slightly thick plate body formed of an opaque white synthesis resin material having light guide characteristics, such as acrylic resin or polycarbonate resin and having substantially the same size as the liquid crystal panel 8. A first main surface of the diffusion light guide plate 21 is mounted to the optical function sheet stacked body of the optical conversion section 4 and the peripheral portion thereof is supported by the bracket member 22. The diffusion light guide plate 21 refracts and diffusely reflects illuminating light incident thereto from a second main surface to thereby diffuse it and allows it to enter the optical conversion section 4 from the first plate main surface side in a state where the brightness thereof has been uniformed throughout the surface of the diffusion light guide plate 21.

The diffusion plate 23 is a plate body formed of a transparent synthesis resin material, such as acrylic resin or the like and having substantially the same size as the liquid crystal panel 8. The diffusion plate 23 is spaced apart from the backlight 3 by a predetermined distance and, in this state, controls incident state of the light emitted from the LEDs 18. As shown in FIG. 2, light control patterns 24 are formed on the surface of the diffusion plate 23 at the sites facing to the light emitting sections 18a of the respective LEDs 18.

Each light control pattern 24 is formed by printing a circular pattern having a diameter slightly larger than that of the light emitting section of the LED 18 using an ink having light reflection/diffusion characteristics. The ink is obtained by mixing a light-shielding agent and light-diffusing agent at a predetermined ratio. Using a screen printing method, the light control pattern is precisely formed. Examples of the light-shielding agent include titanium oxide, barium sulfide, calcium carbonate, aluminum oxide, zinc oxide, nickel oxide, calcium hydroxide, lithium sulfide, ferrosoferric oxide, methacrylic resin powder, sericite, porcelain clay powder, kaolin, bentonite, gold powder, and pulp fiber. Example of the light-diffusing agent include silicon oxide, glass beads, glass fine powder, glass fiber, liquid silicon, crystal powder, gold-plated resin beads, cholesteric liquid crystal solution, and recrystallized acrylic resin powder.

In the light diffusion plate 23, each light control pattern 24 reflects a component of light emitted directly above from the light emitting section 18*a* of the LED 18 disposed immediately under the light control pattern 24. The light emitted from the LED 18 enters the diffusion plate 23 at the portions where the light control patterns have not been formed, that is, at the portions that do not face the light emitting arrays 16. The light directly enters the diffusion plate 23 is thus restricted by the light control patterns 24 to prevent a high brightness area from being generated, with the result that the illuminating light whose brightness has been uniformed is emitted from the entire surface toward the diffusion light guide plate 21.

The light control patterns 24 may be realized by a plurality of dots formed in the area having a diameter slightly larger than that of the light emitting section 18*a*. This configuration restricts the light incident amount by transmitting a part of the emitted light and by reflecting/diffusing a part of the light. Further, in this case, the dot formation density at the center portion of the above area may be made higher than that at the peripheral portion. This configuration serves as a gradation pattern that restricts the incident light amount at the central portion and eliminates the position misalignment with the LED 18. Since the side emission type LED 18 is used as described above, a phenomenon that the illuminating light is focused on the area between the light emitting arrays 16 occurs. In order to prevent the occurrence of this phenomenon, the light control pattern 24 may be formed into an oblong shape.

A part of light which is emitted from the LEDs 18 and enters the diffusion plate 23 at an angle greater than the critical angle is reflected by the surface of the diffusion plate 23. The light emitted from the LEDs 18 of the backlight 3 toward the surrounding, light reflected by the surface of the diffusion plate 23, or light reflected by the light control patterns 24 is then reflected by the reflection section 6 and enters in an effective manner the light guide panel 5 through the diffusion plate 23. The light is repeatedly reflected between the reflection section 6 and diffusion plate 23, thereby increasing reflectance according to enhanced reflection principle.

Figure 4:
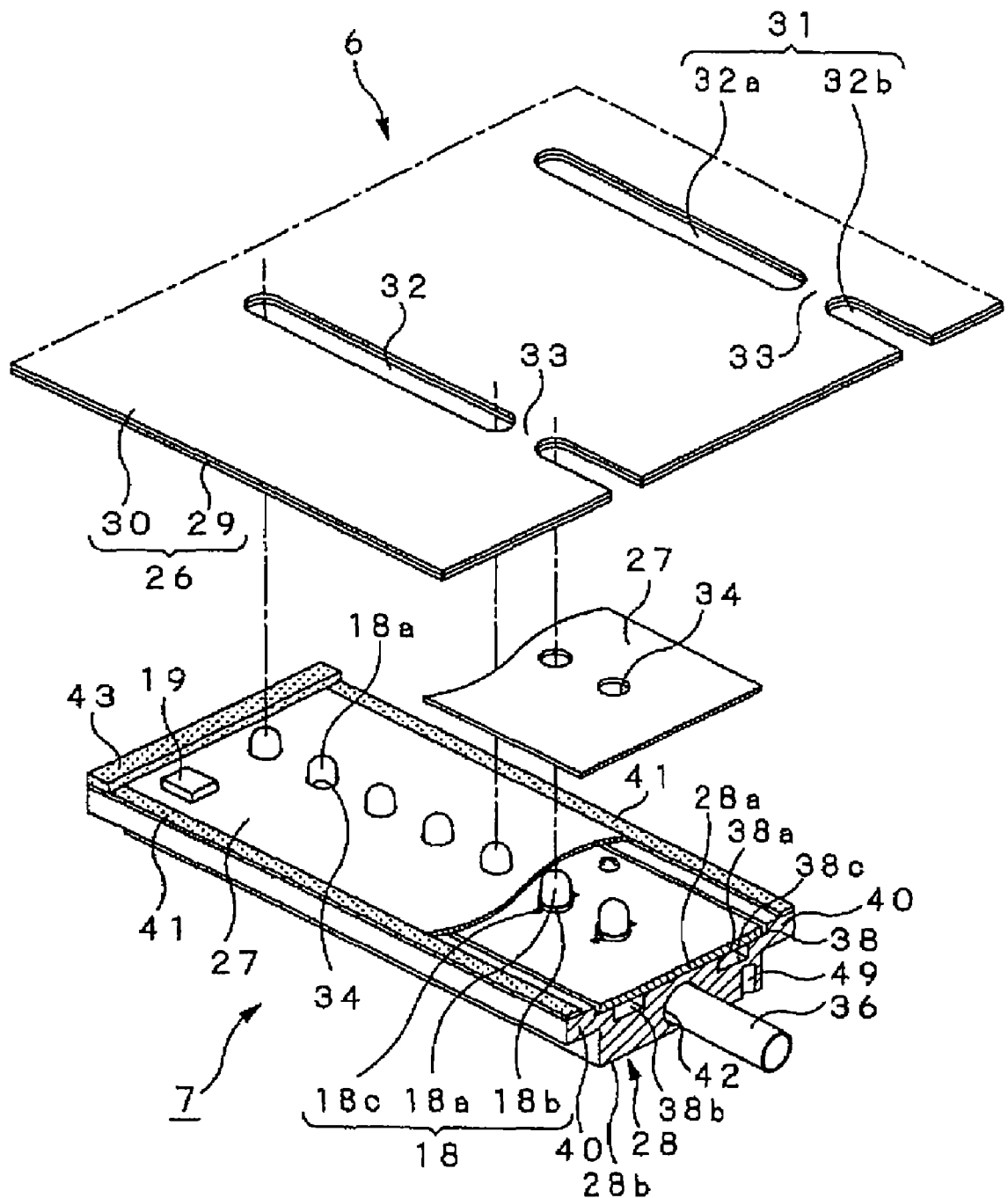
FIG. 4 is an exploded perspective view showing the main part of a light emitting unit and a reflection plate and reflection sheet constituting the reflection section.

The reflection section 6 includes, as shown in FIGS. 2 and 4, a large-sized reflection plate 26 and a plurality of reflection sheets 27 provided for each light emitting unit 15. Although the details will be described later, the reflection plate is mounted to the backlight 3 with the position thereof defined by a radiation plate 28 and optical stud member 25 that constitute a heat radiation section 7. The reflection sheets 27 are held by the reflection plate 26.

In order for the reflection plate 26 to be formed as a large-sized member having comparatively high surface accuracy and free of distortion, and having substantially the same shape as the liquid crystal panel 8 to which the reflection plate 26 is mounted at a predetermined interval relative to the light guide panel 5, a certain degree of mechanical strength is required. Therefore, an aluminum plate 29 is used as a base material and a reflection material 30 made of foamable PET containing fluorescent agent is coupled to the surface of the base material 29, thereby obtaining the reflection plate 26. As the base material, not only the aluminum plate, but also stainless plate having a mirror surface can be used as the reflection plate 26. In the case where the reflection plate 26 is used in a comparatively small-sized liquid crystal display unit, it may be formed by foamable PET containing fluorescent agent, for example. The foamable PET is lightweight, having high reflectance characteristics of about 95%, and having a color tone different from metallic gloss color to make scratches and the like on the reflection surface less noticeable. This foamable PET has been used in conventional type liquid crystal display units.

In the reflection plate 26, six horizontal rows of guide opening portions 31 are formed in correspondence with the respective light emitting arrays 16, as shown in FIG. 3. Each row of the guide opening portions 31 is constituted by a plurality of horizontally long rectangular unit guide openings 32*a* to 32*n* (referred to collectively as "unit guide openings 32") which are arranged on the same axis line and separated by bridge portion 33. Each opening width of the unit guide openings 32 has a diameter slightly larger than that of the light emitting section 18*a* of the LED 18 and has a length long enough to allow the 5 LEDs 18 to penetrate therethrough.

Since 75 LEDs 18 are formed on each light emitting array 16, each row of guide opening portions 31 is constituted by 75 (LEDs)/5 (number of LEDs corresponding to each unit guide opening)=15 unit guide openings 32. The configuration of the guide opening portion 31 is not limited to this. For example, each row of guide opening portions 31 may be constituted by one opening having a length corresponding to the entire length of the each light emitting array 16. However, each bridge portion 33 serves as a portion for maintaining the mechanical strength of the reflection plate 26 and for supporting the reflection sheet 27 as described later. Therefore, it is preferable to form a plurality of openings each having a length enough to allow some LEDs 18 to penetrate therethrough at predetermined intervals.

The reflection sheet 27 is formed by a member having high reflection characteristics, such as foamable PET, and formed into a rectangular shape having the same length and slightly larger width as compared to the wiring substrate 17 and having a slightly smaller width as compared to the radiation plate 28. 25 guide holes 34 are formed on the reflection sheet 27 in correspondence with the 25 LEDs 18 which are formed on the light emitting units 15 and arranged on the same axis line. The guide holes 34 are arranged on the same axis line in the length direction of the reflection sheet 27. Each of the guide holes 34 has a circular shape having substantially the same diameter as that of the light emitting section 18*a* of each LED 18.

The reflection sheet 27 is mounted to the wiring substrate 17 supported by the radiation plate 28 for each light emitting unit 15 with the light emitting sections 18*a* of the LEDs 18 allowed to penetrate through the corresponding guide holes 34. The reflection sheet 27 is formed in a size corresponding to that of each light emitting unit 15 and is directly mounted to the wiring substrate 17, thereby achieving accurate positioning of the LEDs 18 penetrating through the guide holes 34. That is, the light emitting section 18*a* of each LED 18 is projected through the guide hole 34 of the reflection sheet 27 with its outer peripheral wall firmly attached to the inner periphery of the guide hole 34. The width of the reflection sheet 27 may be made equal to or slightly smaller than a substrate-engaging concave portion 38 of the radiation plate 28 to be described later. In this case, the opening edge of the guide hole 34 is supported by the upper surface of the resin holder 18*b* of the LED 18.

As shown in FIGS. 3 and 5, the reflection sheet 27 is mounted to the wiring substrate 17 for each light emitting unit 15 with the light emitting sections 18*a* of the LEDs 18 allowed to penetrate through the corresponding guide holes 34. The reflection plate 26 is disposed on the reflection sheets 27 and is fixed to the radiation plate 28 as described later. In this state, a predetermined of guide holes 34 of the reflection sheets 27 face the respective guide opening portions 31 of the reflection plate 26, allowing the light emitting sections 18a of the LEDs 18 to penetrate through the guide opening portions 31 and face the diffusion plate 23.

The reflection sheet 27 is formed by an insulating foamable PET material and reflection plate 26 is formed by a stacked body including the aluminum plate 29 and a foamable PET material 30. In the reflection section 6, as shown in FIG. 5, the entire inner periphery of the guide hole 34 formed in a smaller diameter on the insulating reflection sheet 27 is projected inward with respect to the inner periphery of the guide opening portion 31 of the reflection plate 26 from which the aluminum base material is exposed. Therefore, in the reflection section 6, intervention of the reflection sheet 27 maintains electrical insulation between the aluminum portion of the reflection plate 26 and terminal 18c of the LED 18.

As described above, the reflection sheet 27 is formed by an insulating foamable PET material and reflection plate 26 is formed by a stacked body including the aluminum plate 29 and a foamable PET material 30. In the mounting state, as shown in FIG. 5, the entire inner periphery of the guide hole 34 formed in a smaller diameter on the insulating reflection sheet 27 is projected inward with respect to the inner periphery of the guide opening portion 31 of the reflection plate 26 from which the aluminum base material is exposed. Therefore, in the reflection section 6, intervention of the reflection sheet 27 maintains electrical insulation between the aluminum portion of the reflection plate 26 and terminal 18c of the LED 18.

After the reflection sheets 27 have been mounted for each light emitting unit 15 in the manner as described above, mounting of the reflection plate 26 is performed. The reflection plate 26 is fixed onto the radiation plate 28, thereby pressing the reflection sheet 27 against the radiation plate 28 for holding. As described above, the guide opening portion 31 is constituted by a plurality of unit guide openings 32 each allowing 5 LEDs 18 to project therethrough with bridge portions 33 intervened between the unit guide openings 32. This configuration causes the bridge portions 33 to press the reflection sheets 27 at predetermined intervals in the length direction, so that the reflection sheets 27 are firmly held. This eliminates the need to provide a structure for preventing occurrence of a lift-up portion in the reflection sheet 27 or vibration thereof to simplify the assembling work.

As described above, the reflection plate 26 of the reflection section 6, which has a size substantially the same as that of the liquid crystal panel 8, is mounted to the backlight 3 through a supporting portion 13a formed on the back panel 13 and optical stud member 25 as shown in FIG. 2. In the case where the guide opening portion 31 of the reflection plate 26 is constituted by a plurality of circular holes each corresponds to one LED 18 like the configuration of the reflection sheet 27, the positioning between the circular hole and LED 18 becomes extremely difficult. When the reflection plate 26 needs to be formed with high dimensional accuracy, and when components of the reflection section 6 need to be positioned with high accuracy for assembling work, manufacturing cost considerably increases due to support for manufacturing highly accurate parts and designing of a highly accurate assembling process. Further, the reflection plate 26 may be distorted by heat change.

The reflection section 6 according to the present embodiment is formed by mounting the reflection plate 26 and a plurality of reflection sheets 27. This configuration prevents a gap from being generated at the outer periphery of the LED 18 to thereby prevent a part of light emitted from the LEDs 18 from being leaked through a gap at the peripheral portion to the back surface side, thereby enhancing light efficiency, with the result that high brightness display is enabled. Since there is no need to provide a structure for preventing the leakage of light from the back surface side, the entire structure of the reflection section 6 can be simplified.

In the liquid crystal display unit 1 according to the present embodiment, a number of optical stud members 25 are attached to the back panel 13, and, by means of the optical stud member 25, the positioning among the optical function sheet stacked body constituting the optical conversion section 4, the diffusion light guide plate 21 and diffusion plate 23 constituting the light guide panel 5, and reflection plate 26 constituting the reflection section 6 is defined and parallelism between the respective main surfaces of the above plates that face each other is maintained with high accuracy throughout the entire surface. The interval and parallelism between the above large-sized plates are thus maintained, thereby preventing occurrence of color irregularities.

A number of engagement holes 23a and 26a are formed on the above diffusion plate 23 and reflection plate 26 for mounting to the optical stud members 25. In a mounting state of the diffusion plate 23 and reflection plate 26, the engagement holes 23a and 26a are positioned between the respective light emitting arrays 16 and arranged on the same axis line.

The optical stud member 25 is a member integrally formed by an opaque white synthetic resin material, such as polycarbonate resin, having light guide characteristics, mechanical strength, and a certain degree of elasticity and is mounted to a mounting portion 35 integrally formed to the back panel 13 as shown in FIG. 2. A number of mounting portions 35 are integrally formed to the back panel 13 on the inner side thereof as substantially trapezoidal projection portions. The upper surface of the mounting portion 35 serves as a placement surface for the diffusion plate 23 and has a mounting hole 35a formed therein. In a state where the backlight 3 has been mounted to the back panel 13, the mounting portions 35 are positioned between the respective light emitting arrays 16.

As shown in FIG. 2, the optical stud member 25 is constituted by a rod-shaped base portion 25a, an engagement portion 25b formed at the leading end of the rod-shaped base portion 25a, a flange-like first backup plate 25c integrally formed around the rod-shaped base portion 25a with a predetermined interval kept from the engagement portion 25b, and a flange-like second backup plate 25d integrally formed around the rod-like base portion 25a with a predetermined interval kept from the first backup plate 25c. The size of the rod-shaped base portion 25a defines the interval between the mounting portion 35 of the back panel 13 and diffusion light guide plate 21. A step portion 25e is provided at the position predetermined distance above the second backup plate 25d.

The rod-shaped base portion 25a is formed into a long tapered cone-like shape whose diameter is slightly larger than that of the engagement hole 23a formed in the diffusion plate 23 at the step portion 25e and gradually decreases toward the leading end. A slot 25f for achieving an elastically deformable portion is formed in a part of the rod-shaped base portion 25a at the position slightly above the step portion 25e. The slot 25f is formed in the area where the diameter of the rod-shaped base portion 25a is larger than the engagement hole 23a of the diffusion plate 23.

The interval between the larger diameter portion of the engagement portion 25b and first backup plate 25c substantially corresponds to the sum of the thicknesses of the back panel 13 and diffusion plate 23. The first backup plate 25c has a diameter slightly larger than that of the engagement hole 26a of the reflection plate 26, and the second backup plate 25d has a diameter slightly larger than that of the engagement hole 23a of the diffusion plate 23.

The reflection plate 26 is mounted onto the mounting portion 35 of the back panel 13 with the engagement hole 26a facing the mounting hole 35a of the mounting portion 35 in a state where the heat radiation section 7 and backlight 3 have been mounted to the back panel 13. In this state, the optical stud member 25 is mounted to the mounting portion 35 from the inner surface side of the back panel 13. The engagement portion 25b is firstly pressed into the mounting hole 35a of the mounting portion 35 through the engagement hole 26a of the reflection plate 26. When passing through the mounting hole 35a, the engagement portion 25b is elastically deformed by the action of a slot 25g and restores to its original state after penetrating the mounting hole 35a. As a result, the optical stud member 25 is vertically mounted to the back panel 13 with the engagement portion 25b retained by the mounting portion 35.

Figure 6:
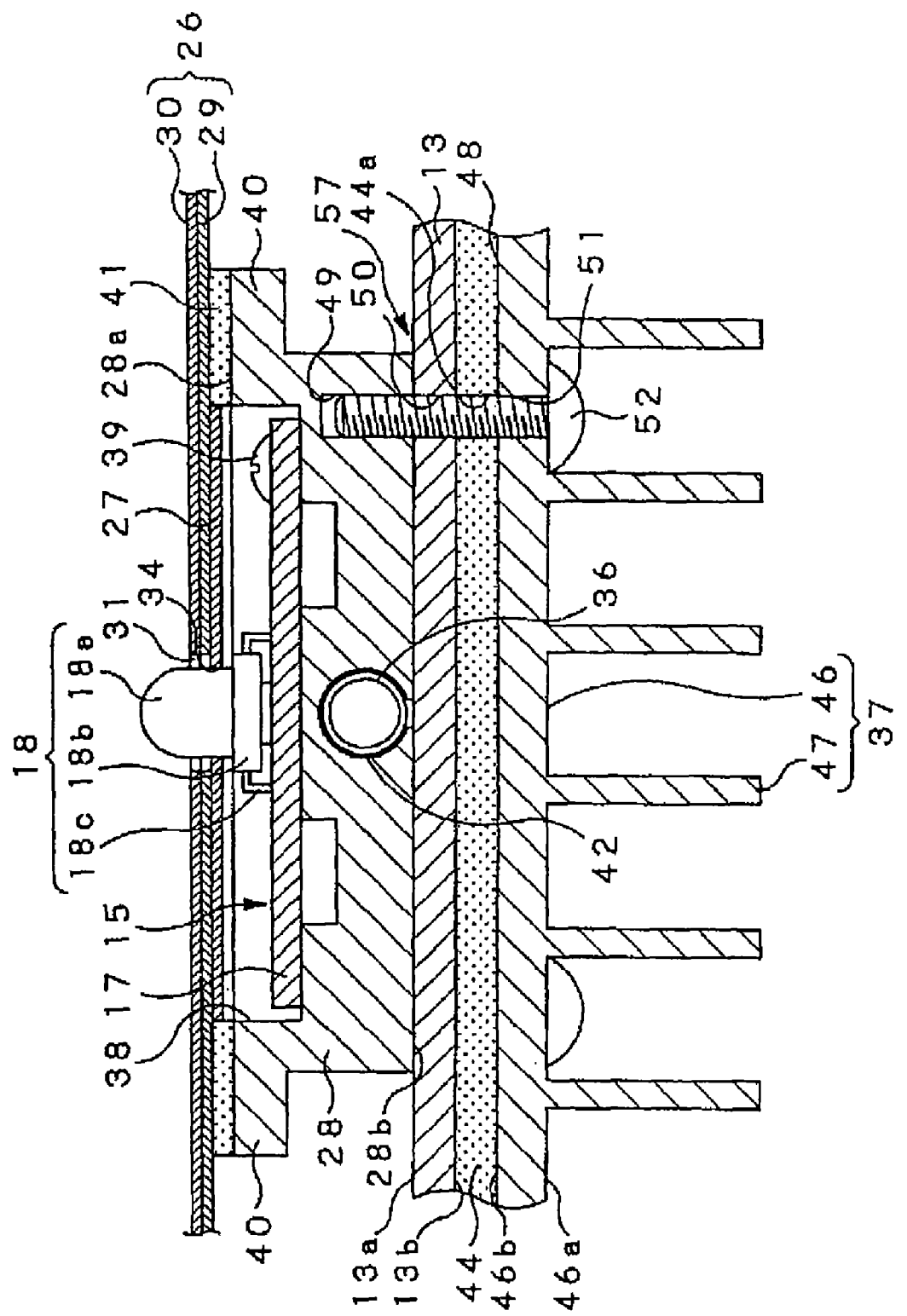
FIG. 6 is a vertical cross-sectional view showing the main part of the light emitting unit and heat sink to be mounted to the back panel.

At this time, the mounting portion 35 and reflection plate 26 are held between the engagement portion 25b and first backup plate 25c of the optical stud member 25 in the thickness direction, as shown in FIG. 6. In this state, the reflection plate 26 is held with the position thereof relative to the back panel 13 fixed and positions the reflection sheets 27 with high accuracy. The upper side of the optical stud member 25 above the first backup plate 25c of the base portion 25a is projected from the reflection plate 26 and positioned above the mounting portion 35 of the back panel 13.

The leading end 25g of the optical stud member 25 is inserted through the engagement hole 23a of the diffusion plate 23, thereby establishing the mounting between the diffusion plate 23 and optical stud member 25. The optical stud member 25 is elastically deformed due to the action of the slot 25f, allowing the diffusion plate 23 which is pressed in the axial direction to pass through the step portion 25e. When the diffusion plate 23 has passed through the step portion 25e and brought into contact with the second backup plate 25d, the larger diameter portion of the optical stud member 25 is elastically restored to its original state. As a result, the diffusion plate 23 is held between the step portion 25e and second backup plate 25d in the thickness direction.

As shown in FIG. 2, the upper side of the optical stud member 25 above the second backup plate 25d of the base portion 25a is projected from the diffusion plate 23. In this state, the bottom surface of the diffusion light guide plate 21 on which the optical function sheet stacked body serving as the optical conversion section 4 has been disposed is brought into contact with the leading end 25g of the optical stud member 25.

As described above, a simple method (that is, the engagement portion 25b is pressed into the mounting hole 35a) is used to mount the optical stud member 25 to the mounting portion 35 of the back panel 13. The use of a number of optical stud members 25 allows the positioning of the diffusion plate 23 and reflection plate 26 and maintains intervals between the diffusion plate 23 and reflection plate 26 and between the diffusion light guide plate 21 and light conversion section 4 with high accuracy, eliminating additional positioning structure and interval retaining structure to thereby simplifying the assembling process.

The optical stud member 25 is applicable to liquid crystal panels 8 of various sizes, achieving shared use of the relevant parts. The configuration of the optical stud member 25 is not limited to that described above but can be appropriately modified depending on the structure of the liquid crystal display unit 1. In the above example, the slot 25g is formed in the engagement portion 25b to allow the optical stud member 25 to elastically be deformed and pressed into the mounting portion 35a of the back panel 13. Alternatively, however, retaining projection is integrally formed to the outer periphery of the optical stud member 25 and key groove is formed in the inner periphery of the mounting hole 35a. In this case, after being inserted through the mounting portion 35a, the optical stud member 25 is rotated to prevent slipping out.

As described above, the above respective plates are positioned with high accuracy by the optical stud member 25. As a result, stable light guide, diffusion, reflection can be realized in the light guide space 14 between the liquid crystal panel 8 and backlight 3, thereby preventing occurrence of color irregularities on the liquid crystal panel 8. Being formed by an opaque white synthetic resin material having light guide characteristics as described above, the optical stud member 25 diffuses illuminating light from outside the light guide space 14 to prevent the leading end 25g from partially glowing, allowing the uniform illuminating light to enter the diffusion light plate 21 from the light guide space 14.

As shown in FIG. 3, a total of 15 (5 in the horizontal direction×3 in the vertical direction) optical stud members are mounted to the back panel 13 at the positions between the respective light emitting arrays 16. Since characteristics of the diffusion plate 23 on the surface of which the light control pattern has been formed or reflection plate 26 obtained by connecting the aluminum plate 29 and formable PET material 30 differ between the front and back surfaces, it needs to be disposed without mistaking the front and back thereof.

A total of 15 (5 in the horizontal direction×3 in the vertical direction) engagement holes 23a and 26a through which the rod-shaped base portion 25a of the optical stud member 25 penetrates are formed respectively on the diffusion plate 23 and reflection plate 26 in correspondence with the mounting positions of the respective optical stud members 25. As shown in FIG. 3, the second optical stud member 25A from the left in the lowermost row stands on the back panel 13 at a different horizontal position from the optical stud members 25 in the upper side rows. Correspondingly, the second engagement holes 23a and 26a from the left in the lowermost row corresponding to the optical stud member 25A are formed respectively in the diffusion plate 23 and reflection plate 26 at a different horizontal position from the engagement holes 23a and 26a in the upper side rows.

Therefore, even if the front and back surfaces are reversed to each other, no engagement hole 23a nor 26a exists at the position corresponding to the optical stud member 25A, it is impossible to mount the diffusion plate 23 and reflection plate 26 to the back plate 13 using the optical stud member 25. As described above, improper mounting of the diffusion plate 23 or reflection plate 26 can be prevented.

The back panel 13 is formed by using an aluminum material which is comparatively lightweight and has a mechanical strength and is formed in a size slightly larger than that of the liquid crystal panel 8. The back panel 13 serves as a chassis member with respect to the constituent materials and has high heat conductivity characteristics. Therefore, the back panel 13 has a function of radiating heat generated in the light guide space 14 or circuit components. Further, the back panel 13 serves also as a heat conduction member that effectively perform heat conduction between the radiation plate 28 and heat sink 37 that constitute a heat radiation section 7.

As described above, the back panel 13 has a peripheral wall for mounting to the front frame member 9 and holder frame member 10 at its periphery, a mounting portion 35 with respect to the optical stud member 25, a mounting portion with respect to the radiation plate 28, an opening for drawing a lead wire, an engagement portion, and the like. Although not shown, a number of mounting portions and mounting holes for fixing a casing are formed in the back panel 13.

The radiation plate 28 is mounted to an inner side first surface 13a of the back panel 13, and heat sink 42 and a control circuit section are mounted to an outside second surface 13b. As described above, the back panel 13 is a member formed by an aluminum material having a high mechanical strength. However, increase in the thickness of the back panel 13 results in increase in the thickness and weight of the entire liquid crystal display unit 1. When the thickness of the back panel 13 is reduced, the mounting portion thereof is deformed when tightly screwed with the radiation plate 28, resulting in occurrence of distortion in the above optical plate members. By utilizing the radiation plate 28 and heat sink 37 each having comparatively large thickness, the reduction in the thickness of the back panel 13 can be achieved while maintaining a mechanical strength.

In the liquid crystal display unit 1 according to the present embodiment, a large number of LEDs 18 are provided in the backlight 3. A large amount of illuminating light generated by light emission of the LEDs 18 is irradiated onto the liquid crystal panel unit 2, thereby achieving high brightness image display. At this time, heat generated from the LEDs 18 is accumulated in the enclosed light guide space 14 between the liquid crystal panel unit 2 and backlight 3 to increase the temperature of the entire unit. The increase in the temperature of the liquid crystal display unit 1 changes characteristics of the optical function sheets of the light conversion section 4 or makes lighting state of the LEDs 18 unstable to generate color irregularities on the liquid crystal panel 8, or makes operation of electronic parts constituting the circuit section unstable or changes the dimension of the constituent members.

In order to achieve stable operation of the liquid crystal display unit 1 according to the present embodiment, the heat generated from the LEDs 18 is effectively radiated by the heat radiator section 7. The heat radiation section 7 is constituted by a radiation plate 28 serving also as a mounting member with respect to the light emitting unit 15, a heat pipe 36 to be mounted to the radiation plate 28, a pair of left and right heat sinks 37, 37 disposed on back side of the back panel 13 which is connected to the end portion of the heat pipe 36 and receives heat, and cooling fans 45, 45 that promote cooling function of the heat sinks 37.

One radiation plate 28 is provided for each of six rows of light emitting array 16. An aluminum material which has excellent heat conductivity and processability and which is lightweight and cheap is used as a material of the radiation plate 28. Extrusion processing is used to form the radiation plate 28 into a long rectangular plate having the length and width substantially the same as those of each light emitting array 16. Serving as a mounting member to which 3 light emitting units 15 are mounted, each radiation plate 28 is formed to have a predetermined thickness so as to be provided with a certain degree of mechanical strength. The material of the radiation plate 28 is not limited to the aluminum material but other materials having excellent heat conductivity, such as an aluminum alloy material, magnesium alloy material, silver alloy material, or copper alloy material may be used. In the case where the size of the liquid crystal display unit 1 is comparatively small, press working or cutout working may be used to from the radiation plate 28.

Three wiring substrates 17 each constituting the light emitting unit 15 are mounted to a first surface 28a of each radiation plate 28 with their end surfaces confronting each other, as shown in FIG. 5. A substrate-engaging concave portion 38 with which the wiring substrate 17 is engaged is formed on the first surface 28a of each radiation plate 28 throughout the entire length thereof. The substrate-engaging concave portion 38, which has substantially the same width as that of the wiring substrate 17 and has a height slightly greater than the thickness of the wiring substrate 17, holds the bottom surface and both side edge portions in the width direction of the wiring substrate 17. The wiring substrate 17 engaged in the substrate-engaging concave portion 38 is fixed by a plurality of screws 39.

A supporting convex portion 38a and concave-shaped portions 38b and 38c are formed in the substrate-engaging concave portion 38. The supporting convex portion 38a is formed by leaving the center area in the width direction as a convex portion having a predetermined width and extends in the length direction in which the bottom surface of the wiring substrate 17 is firmly attached. The concave-shaped portions 38b and 38c extend along the both sides of the supporting convex portion 38a throughout the entire length thereof. As shown in FIG. 5, the supporting convex portion 38a has a width corresponding to the LED mounting area of the wiring substrate 17. Therefore, heat is conducted from the LED mounting area which is heated most by the lighting operation of the LEDs 18, so that effective heat radiation is performed. Although the concave-shaped portions 38b and 38c are formed for achieving a reduction in weight and maintaining dimensional accuracy, they may be formed as a heat pipe-engaging portion.

Reflection plate-receiving sections 40, 40 are integrally formed to each radiation plate 28. The reflection plate-receiving sections 40, 40 extend along the opening edges of the substrate-engaging concave portion 38 throughout the entire length thereof. The reflection plate-receiving sections 40, 40 are plate-like portions projected from the opening edges of the substrate-engaging concave portion 38 of the radiation plate 28 in the width direction. Thus, as shown in FIG. 5, the width of the first surface 28a of the radiation plate 28 is made lager than that of the reflection sheet 27. In the mounting state, the reflection plate-receiving sections 40, 40 allow the light emitting section 18a of each LED 18 to be projected through the corresponding guide hole 34 and support both side edges of the reflection sheet 27 mounted to the light emitting unit 15.

In the case where the reflection sheet 27 has a width larger than that of the opening width of the substrate-engaging concave portion 38, the reflection plate-receiving sections 40, 40 support the both ends thereof. In this case, the reflection plate-receiving sections 40, 40 hold the reflection sheet 27 at the level at which the light emitting section 18a of each LED 18 is projected through the corresponding guide hole 34.

In the heat radiation section 7, six radiation plates 28 are mounted to the inner surface of the back panel 13 at predetermined intervals from one another. Each of the radiation plate 28 serves as a mounting member with respect to the six light emitting arrays 16, and three light emitting units 15 including the wiring substrate 17 on which a predetermined number of LEDs 18 are mounted are mounted in the substrate-engaging concave portion 38 of each radiation plate 28. In a state where the reflection sheet 27 has been mounted to the light emitting unit 15, the reflection plate 26 constituting the reflection section 6 covers the radiation plate 28.

The inner surface of the reflection plate 26 is pressed against the reflection plate-receiving sections 40, 40. Double-faced tape 41, 41 are previously adhered on the reflection plate-receiving sections 40, 40 throughout the entire length thereof and fix the inner surface of the pressed reflection plate 26. The outer periphery of the reflection plate 26 is supported on the supporting portion 13a formed in the back panel 13 as described above. Further, the reflection plate 26 is held by the optical stud member 25 in the area between the respective light emitting arrays 16, and supported on the reflection plate-receiving sections 40, 40 of the radiation plate 28 constituting the light emitting array 16. The reflection plate 26 is positioned with high accuracy by the above configuration and therefore is mounted to other members without distortion.

Each radiation plate 28 constituting the heat radiation section 7 serves as a mounting member with respect to the light emitting unit 15 of the backlight 3 and serves also as a mounting member with respect to the reflection plate 26 constituting the reflection section 6. Thus, the radiation plate 28 is integrated with the large-sized reflection plate 26 and serves also as a reflection plate, defining the mounting position of the reflection plate 26 with high accuracy, increasing light use efficiency, and preventing occurrence of color irregularities. Further, reflection plate 26 can be mounted to the radiator heats 28 with a simple work. Although the double-faced tape 41, 41 adhered on the reflection plate-receiving sections 40, 40 are used to fix the reflection plate 26 to the radiation plates 28 in the above example, adhesive may be used in place of the double-faced tape 41, 41.

As described above, the substrate-engaging concave portion 38 is formed on one surface of the radiation plate 28 throughout the entire length thereof, and the wiring substrate 17 of each light emitting unit 15 is mounted in the substrate-engaging concave portion 38. The reflection plate 26 is fixed onto the reflection plate-receiving portion 40 to thereby close the substrate-engaging concave portion 38. In this state, the LEDs 18 are projected through the guide holes 34 formed in the reflection sheet 27 with the outer periphery thereof firmed attached to the inner periphery of each guide hole 34. Thus, the one surface side of the substrate-engaging concave portion 38 is closed by the reflection plate 26 to bring the space in the substrate-engaging concave portion 38 into a sealed state, thereby ensuring dust-proofness.

Since the substrate-engaging concave portion 38 is formed on one surface of the radiation plate 28 throughout the entire length thereof, the end surface side of the radiation plate 28 is opened. A dust-proof member 43 made of an urethane foam resin material or sponge material is fixed onto the end surface side of the reflection plate-receiving portion 40 formed along the side surface of the radiation plate 28, as shown in FIG. 4. Thus, the end surface side of the substrate-engaging concave portion 38 is closed by the dust-proof member 43, thereby preventing dust from entering the inside of the substrate-engaging concave portion 38.

A heat pipe-engaging concave portion 42 to which the heat pipe 36 is mounted and a plurality of mounting studs and positioning dowels constituting a mounting portion with respect to the back panel 13 are integrally formed to the second surface 28b side opposite to the first surface 28a. The heat pipe-engaging concave portion 42, which is formed as a concave groove having an arched opening cross-section, is positioned at substantially the width direction center of the second surface 28b opposite to the supporting convex portion 38a on the first surface 28a side and extends and opens over the entire radiation plate 28 in the length direction thereof. The heat pipe-engaging concave portion 42 has an opening width substantially equal to the outer diameter of the heat pipe 36. Projections 42a and 42b for caulking are integrally formed to the opening edge of the heat pipe-engaging concave portion 42.

The heat pipe 36 is mounted in the heat pipe-engaging concave portion 42. The heat pipe 36 is inserted into the inside of the heat pipe-engaging concave portion 42 from the opening thereof and mounted to the concave portion 42 with the outer periphery of the heat-pipe 36 firmly attached to the inner wall of the heat pipe-engaging concave portion 42. At this time, as shown in FIG. 5, the projections 42a and 42b for caulking are deformed so as to close the opening. The heat pipe 36 is thus mounted to the portion facing the mounting area of the LED 18 throughout the entire length thereof, thereby achieving effective heat radiation.

As described above, the heat pipe 36 is mounted in the heat pipe-engaging concave portion 42 formed on the radiation plate 28. That is, the radiation plate 28 serves also as a holding member for holding the heat pipe 36, simplifying the mounting structure of the heat pipe 36. This makes it easy to treat the fragile heat pipe 36 at the mounting time thereof, surely preventing the heat pipe from being bent or damaged. The light emitting unit 15 and heat pipe 36 are positioned closely adjacent to each other to thereby effective form heat conduction path between them.

Although the heat pipe 36 is mounted in the heat pipe-engaging concave portion 42 that opens to the second surface 28b of the each radiation plate 28, another configuration may be employed. For example, a heat pipe-engaging hole that opens at at least one end portion in the length direction of the radiation plate 28 may be formed. In this case, the heat pipe 36 is mounted inside the heat pipe-engaging hole from the side surface direction.

The heat pipe 36 is a member widely used for conducting heat from a power source which is subjected to high temperatures in various electronic devices to a heat radiation means. The heat pipe 36 is formed by encapsulating a conducting medium evaporated at a predetermined temperature, such as water, in a metal pipe material excellent in heat conductivity, such as copper, in an evacuated state and therefore has high efficiency heat conduction capability. As described above, the heat pipe 36 is integrally mounted to each radiation plate 28 with its both end portions connected to the heat sink 37. When the heat pipe 36 receives heat conduction from the radiation plate 28 of high temperature, the conducting medium encapsulated in the heat pipe 36 evaporated from liquid to vapor. The evaporated conducting medium flows in the pipe to the connection portion to the heat sink 37 of low temperature. As a result, the medium is cooled to discharge condensing heat to thereby become liquid. The liquefied conducting medium is moved to the radiation plate 28 side through a plurality of strap-groove extending in the length direction or porous layer formed in the inner surface of the metal pipe by capillary phenomenon and so as to be circulated in the pipe, thereby achieving high efficiency heat conduction.

In a state where the light emitting unit 15 has been mounted in the substrate-engaging concave portion 38 as well as the heat pipe 36 has been mounted in the heat pipe-engaging concave portion 42, the radiation plate 28 is mounted to the back panel 13 with high positioning accuracy. As shown in FIG. 3, the radiation plates 28 are so mounted to the first surface 13a of the back panel 13 as to extend throughout the entire length of the back panel 13 and arranged at predetermined intervals in the width direction, thereby forming the light emitting arrays 16.

Although details are omitted here, as shown in FIG. 3, the heat sinks 37, 37 are disposed at both length direction end portions on the second surface 13b side of the back panel 13. The radiation plates 28 on both sides extend perpendicular to the heat sinks 37 through the back panel 13. The radiation plates 28 and heat sinks 27 are integrally fixed to each other by screws 52 serving as a fixing member with the back panel 13 interposed therebetween.

The above fixing member is not limited to a screw but a combination of pin, bolt, nut or any other fixing members may be used as far as they can integrate the radiation plates 28, heat sinks 37, and back panel 13 disposed between them.

The heat sink 37 is a member which is used by itself or by combing with the heat pipe 36 as a radiation member for a power source in various electronic devices. The heat sink 37 receives heat conduction from high temperature side and performs heat radiation to thereby cool the high temperature portion. As in the case of a conventional typical heat sink, the heat sink 37 is formed by applying extrusion processing or cutting work to a metal material having high conductivity, such as an aluminum material. The heat sink 37 is constituted by a base 46 serving as a mounting portion with respect to the back panel 13 and a plurality of fins 47 integrally standing from a first main surface 46a of the base 46 and radiating heat generated in the LEDs 18 from the surface thereof.

Figure 8:
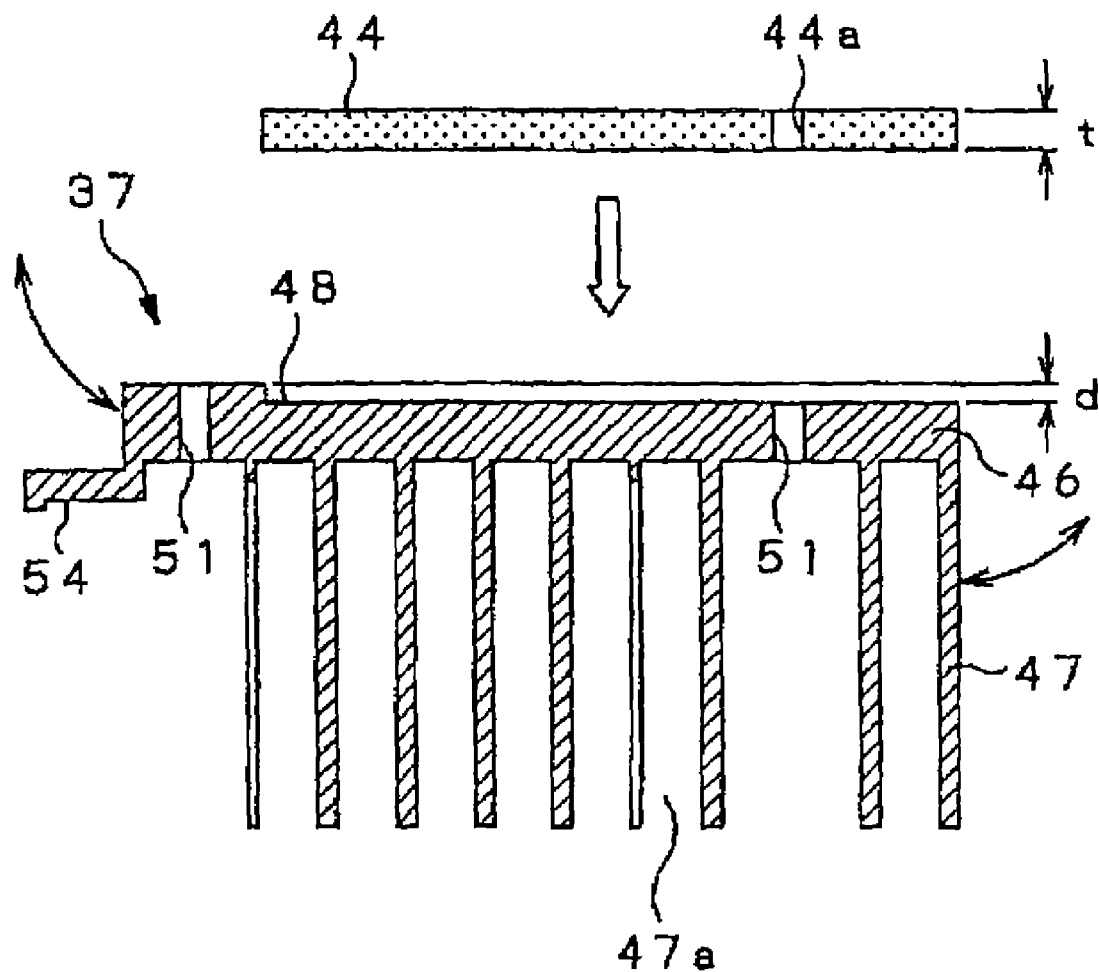
FIG. 8 is a vertical cross-sectional view showing the heat sink and a radiation sheet.

The base 46 is formed into a rectangular shape having a length substantially equal to the width (height) of the back panel 13. Since the base 46 has a certain degree of thickness, the heat sink 37 is provided with a sufficient mechanical strength. As shown in FIGS. 6 and 8, a plurality of mounting holes 51 are formed in correspondence with mounting holes 50 formed in the back panel 13 and mounting holes 49 formed in the radiation plate 28.

Further, a radiation sheet-engaging concave portion 48 to which a radiation sheet 44 to be described later is mounted is formed on a second surface side 46b of the base 46 constituting a mounting surface with respect to the back panel 13. As shown in FIG. 8, the radiation sheet-engaging concave portion 48 has an opening which is slightly larger than the outer shape of the radiation sheet 44 and which has a slightly smaller depth d than the thickness t of the radiation sheet 44.

Further, as shown in FIG. 8, a combination portion 54 is integrally formed along the width direction one side of the heat sink 37. A plurality of heat sinks 55 and 56 are combined in accordance with the size of the liquid crystal panel 8 at the combination portion 54 to form the heat sink 37 having a predetermined radiation amount. The heat sink 37 has mounting holes 51 penetrating in the thickness direction thereof at appropriate positions in the base 46 and combination portion 54.

As shown in FIGS. 6 and 8, the fins 47 are thin upright walls integrally standing on the first main surface 46a of the base 46 throughout the entire length thereof. Although the fins 47 are disposed in parallel to one another, it is not particularly necessary to make the thicknesses thereof and intervals therebetween equal among them. The fins 47 constitute a plurality of striped cooling space 47a on the first main surface 46a of the base 46 throughout the entire length thereof.

Since the heat sink 37 is constituted by integrally forming a plurality of fins 47 on the base 46 as described above, the thickness of the heat sink 37 is likely to change in the width direction, making a change due to processing accuracy or heat expansion or spring-back phenomenon at processing time more likely to occur. Therefore, a force in the direction denoted by an arrow in FIG. 8 is applied to the base 46, so that a warpage is likely to occur in the width direction. This warpage of the base 46 occurs in both directions in which the fins 47 are opened or closed depending on the processing condition.

The heat sink 37 is integrated with the radiation plate 28 with the back panel 13 interposed therebetween as described later. When the warpage occurs in the base 46, it becomes difficult to firmly attach the second main surface 46b of the base 46 to the entire second surface 13b of the back panel 13. As a result, a gap is formed between the heat sink 37 and back panel 13, deteriorating the heat conduction efficiency of the heat conduction path formed between the heat sink 37 and radiation plate 28 through the back panel 13. Further, when warpage of the base 46 is corrected by tightly fastening the screws 52, back panel 13 is deformed.

In light of the above, the heat sink 37 is mounted to the back panel 13 through the radiation sheet 44. The radiation sheet 44 is formed by silicone resin having a certain degree of heat conduction characteristic and elastic deformation characteristics. As described above, the radiation sheet 44 has an outer length slightly smaller than the opening length of the radiation sheet-engaging concave portion 48 formed on the heat sink 37 and has a thickness slightly larger than the depth of the radiation sheet-engaging concave portion 48. A plurality of mounting holes 44a are so formed on the radiation sheet 44 as to penetrate therethrough in the thickness direction at the portions corresponding to the mounting holes 51 formed on the heat sink 37 side.

The radiation sheet 44 is integrally fixed in the radiation sheet-engagement concave portion 48 of the heat sink 37 by, for example, adhesive, with a part of the sheet in the thickness direction projected from the second main surface 46b of the base 46. In this state, each mounting hole 44a of the radiation sheet 44 communicate with the corresponding mounting hole 51 on the base 46 side.

A plurality of radiation plate 28 constituting the light emitting arrays 16 are mounted to the first surface 13a of the back panel 13 with predetermined intervals spaced from one another with respect to the length direction. Further, the heat sinks 37 to which the radiation sheets 44 are fixed respectively are so disposed at both length direction end portions on the second surface 13b side of the back panel 13 as to extend perpendicular to the radiation plates 28 on both sides. Therefore, as shown in FIG. 3, overlap portions in which the radiation plate 28 and heat sink 37 are overlapped with each other through the back panel 13 at a plurality of positions are formed on both sides in the length direction of the back panel 13. In each overlap portion 57, the mounting hole 49 formed in the radiation plate 28, mounting hole 50 formed in the back panel 13, mounting hole 44a formed in the radiation sheet 44, and mounting hole 51 formed in the heat sink 37 communicate with one another. In this state, the screw 52 is inserted into the above mounting holes 49, 50, 44a, 51 from, e.g., heat sink 37 side to thereby integrate the radiation plate 28 and heat sink 37 with each other through the back panel 13.

As described above, the back panel 13 is formed in a smaller thickness while the radiation plate 28 and base 46 of the heat sink 37 are formed into a larger thickness. Thus, even when the screw 52 is tightly fastened, partial deformation does not occur in the back panel 13, so that the radiation plate 28 and heat sink 37 can firmly be fixed to the back panel 13. Further, the back panel 13 is sandwiched between the radiation plate 28 and heat sink 37 mounted to each other in a lattice form, so that a mechanical strength of the back panel 13 is enhanced.

The heat sink 37 is mounted to the back panel 13 in a state where the radiation sheet 44 is fixed in the radiation sheet-engaging concave portion 48 formed in the base 46. As the screw 52 is inserted into the above fixing holes, the radiation sheet 44 is compressed in the thickness direction between the back panel 13 and base 46 to be deformed. Thus, even when the warpage occurs in the base 46, the firm attachment between the second surface 46b of the base 46 and second surface 13b of the back panel 13 is maintained by the radiation sheet 44. With the above configuration, a heat conduction path is formed between the radiation plate 28 and heat sink 37 through the back panel 13 and radiation sheet 44, with the firm attachment between the above members 28, 37, 13, and 44 maintained, thus achieving satisfactory heat radiation.

The larger the size of the heat sink 37 is, the higher the heat conduction effect the liquid crystal display unit 1 offers. However, the increase in the size of the heat sink 37 increases the thickness of the backlight 3 or entire units, resulting in increase in the size of the entire unit. The heat sink 37 is a member having large size and weight. Further, when being directly mounted to the wiring substrate or the like, the heat sink 37 needs to be provided with a mounting bracket member for maintaining insulation between itself and circuit parts or wiring patterns or a heat conduction member interposed between itself and a high temperature portion, complicating the structure.

As described above, in the liquid crystal display unit 1 according to the embodiment, a plurality of radiation plates 28 and heat pipes 36 are used to skillfully dispose each heat sink 37 which is a comparatively large-sized parts relative to the back panel 13 to form an effective heat conduction path between the radiation plate 28 and heat pipe 36 through the back panel 13 and radiation sheet 44. As a result, increase in the size of the unit 1 itself can be prevented and heat generated from the backlight 3 can effectively be radiated.

Figure 7:
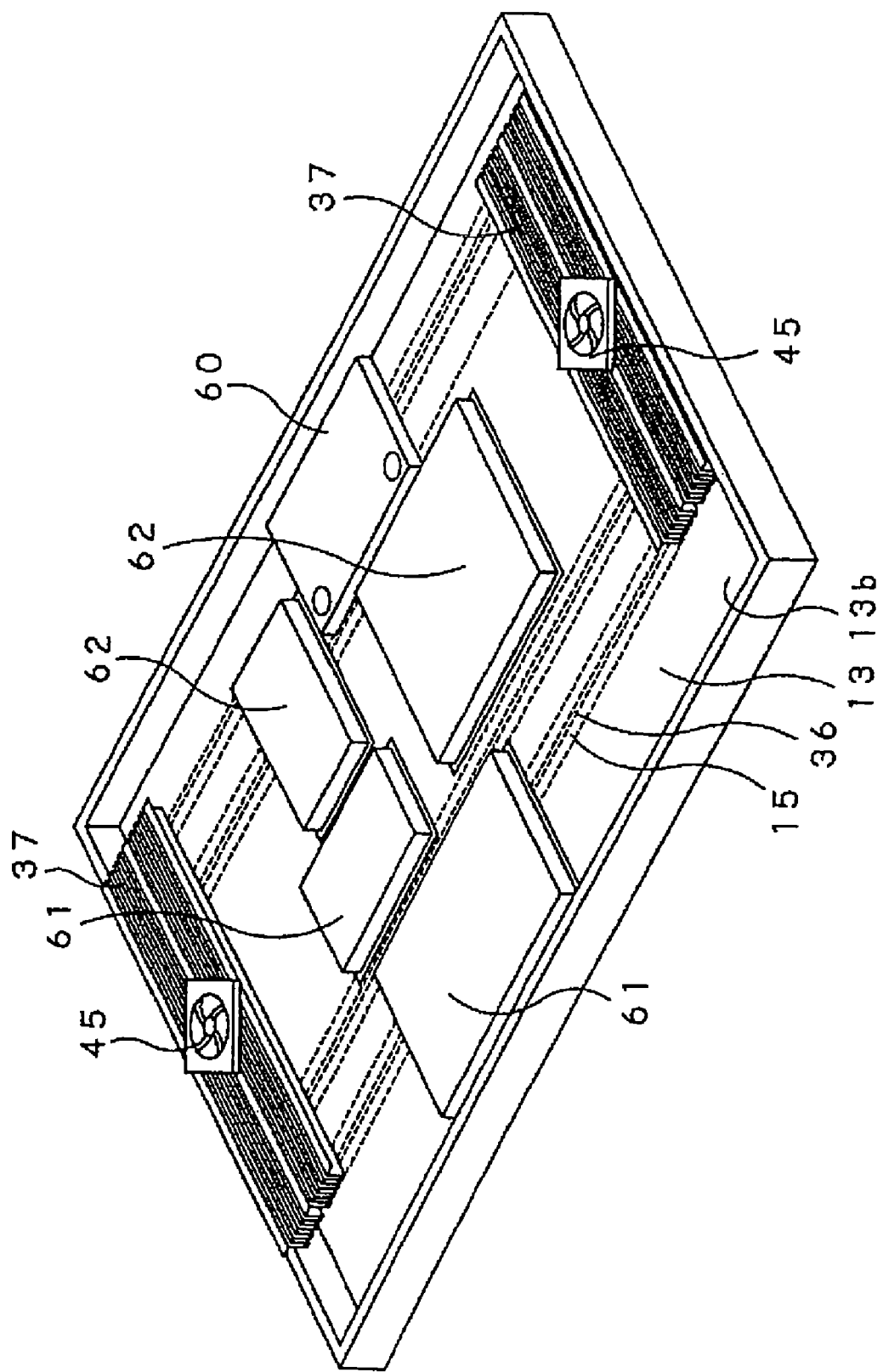
FIG. 7 is a perspective view showing the back panel on which a control circuit section has been mounted.
Figure 9:
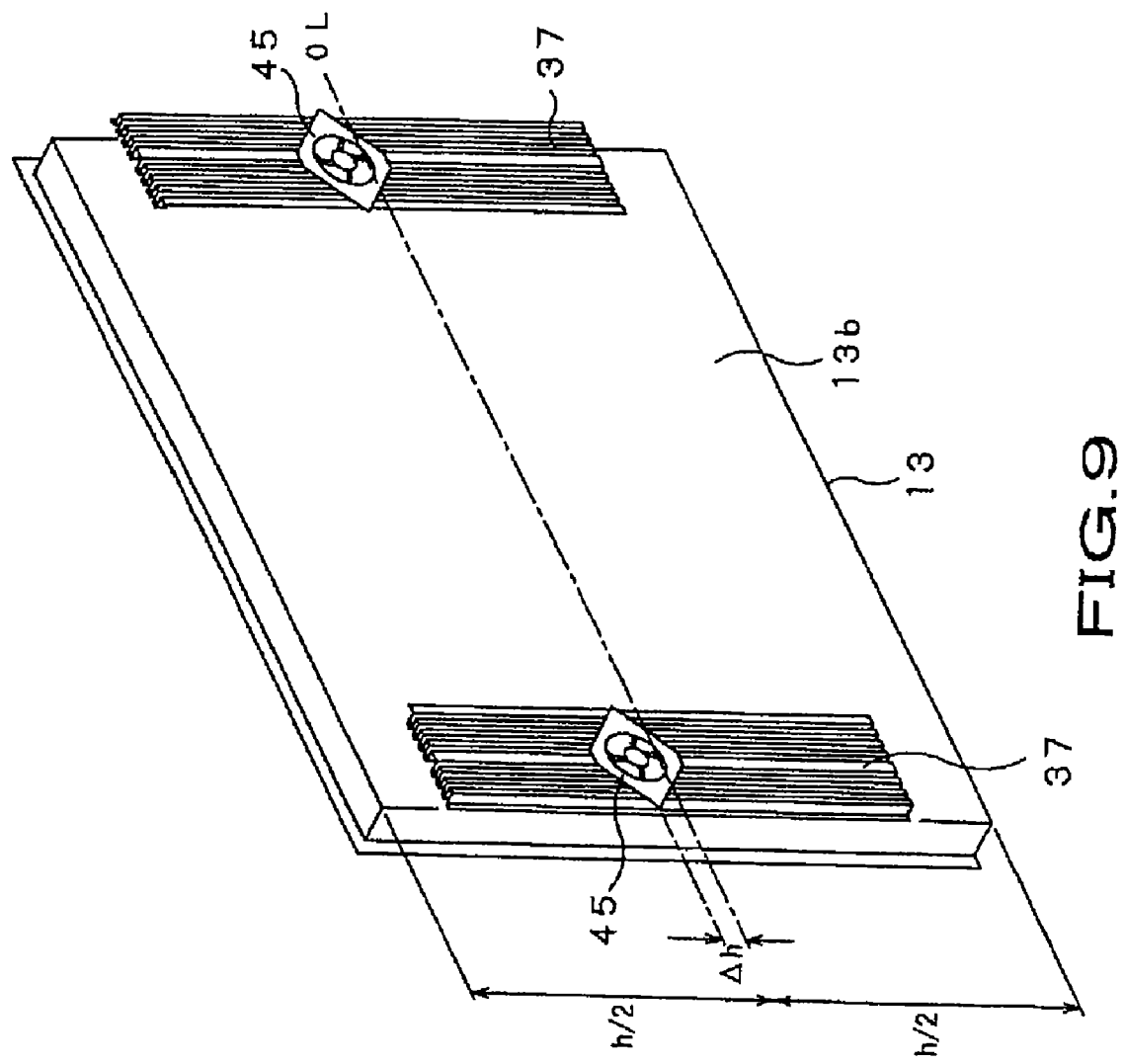
FIG. 9 is a perspective view showing the back surface side of the back panel.

Further, as shown in FIGS. 7 and 9, cooling fans 45 are provided in the respective heat sinks 37 to thereby enhance the radiation effect of the heat sink 37. Although not shown, the cooling fan 45 is disposed at the portion obtained by cutting a part of a back cover which is so mounted as to close the radiation space 47a formed between the fins 47 of the heat sink 37.

Although the details are omitted here, the cooling fan 45 includes a casing having a mounting portion, a motor disposed at the center of the casing through a plurality of arm portions, and a fan driven by the motor. The main surface of the casing of the cooling fan 45 in the thickness direction is opened, and the cooling fan 45 is mounted to the heat sink 37 with the opening facing the radiation space 47a. When power is applied to the motor to drive the fan, cooling air is supplied to the radiation space 47a between the fins 47 of the heat sink 37 to promote heat radiation from fins 47.

Since the liquid crystal display unit 1 is used in a state where the liquid crystal panel 8 is vertically upright, heat generated from the LEDs 18 is moved up and accumulated in an upper region. Therefore, the cooling fan is so disposed as to radiate the heat accumulated in the upper region. Thus, the heat generated from the LEDs 18 can effectively be radiated. That is, as shown in FIG. 9, the cooling fan 45 is mounted to the heat sink 37 at the position shifted by Δh from the center line OL in the height direction.

Therefore, more cooling air is supplied to the upper side region of the unit to enhance heat radiation effect in the upper side region of unit by the heat sink 37, with the result that uniform temperature distribution can be achieved in the entire unit. Under the uniform temperature, occurrence of color irregularities is suppressed and stable operation is performed in the liquid crystal panel 8 and other optical plates. Further, since it is not necessary to provide a high-airflow cooling fan 45, power consumption and fan noise can be reduced.

The cooling fan 45 has a substantially square casing, each corner of which a mounting portion is provided. In the case where the cooling fan 45 is mounted to the heat sink 37 with the both sides of the casing parallel to the fins 47, the mounting portions close a part of the radiation spaces 47a to deteriorate cooling fan efficiency. Therefore, as shown in FIG. 7, the cooling fan 45 is mounted to the fins 47 with the side surfaces tilted by about 90° with respect to the fins 47. As a result, the cooling air can be supplied from the entire opening to the radiation space 47a. The cooling fan 45 may be provided inside the radiation space 47a to enhance heat radiation from the fins 47.

By forming the heat pipe-engaging concave portion 42 in the radiation plate 28 as described above, it becomes unnecessary to form a clearance concave portion for arranging the heat pipe 36 on the back panel 13. Thus, the back panel 13 can be formed into a flat shape as a whole, resulting in a reduction in thickness. The heat sinks 37 are mounted to the both sides of the back side of the back panel 13, and a flat area is formed in the center area of the back panel 13.

The liquid crystal display unit 1 according to the present embodiment is provided with an LC controller 60 that outputs an operation control signal to the liquid crystal panel 8 and a control circuit section such as a power source control circuit section 61 that controls the liquid crystal panel 8 or a power source or an LED control unit 62 that controls the operation of the backlight 3. As shown in FIG. 7, the control circuit section 61 is mounted on the second surface 13b of the back panel 13. Further, the control circuit section 62 is also mounted in the center portion of the flat control substrate disposed between the heat sinks 37.

Thus, by disposing the control circuit sections 61 and 62 in the flat area of the back panel 13, it is possible to mount them with a simple process without occurrence of lift-up portion or the like. When the control circuit sections 61 and 62 are each packaged and the thicknesses thereof are reduced, it is possible to reduce the thickness of the entire unit.

In the case where the liquid crystal display unit 1 is used as a display unit of a TV set, the screen size thereof is formed in a size of e.g., 40, 42, 46, and 55 inches. As the screen size becomes large, more LEDs 18 needs to be provided in the backlight 3 so as to supply a large amount of illuminating light to the liquid crystal panel 8 in order for the liquid crystal panel 8 to maintain the display brightness. The increase in the number of LEDs 18 to be used increases the amount of heat generated from the LEDs 18, with the result that more efficient heat radiation needs to be performed in the radiation section 7.

Figure 11:
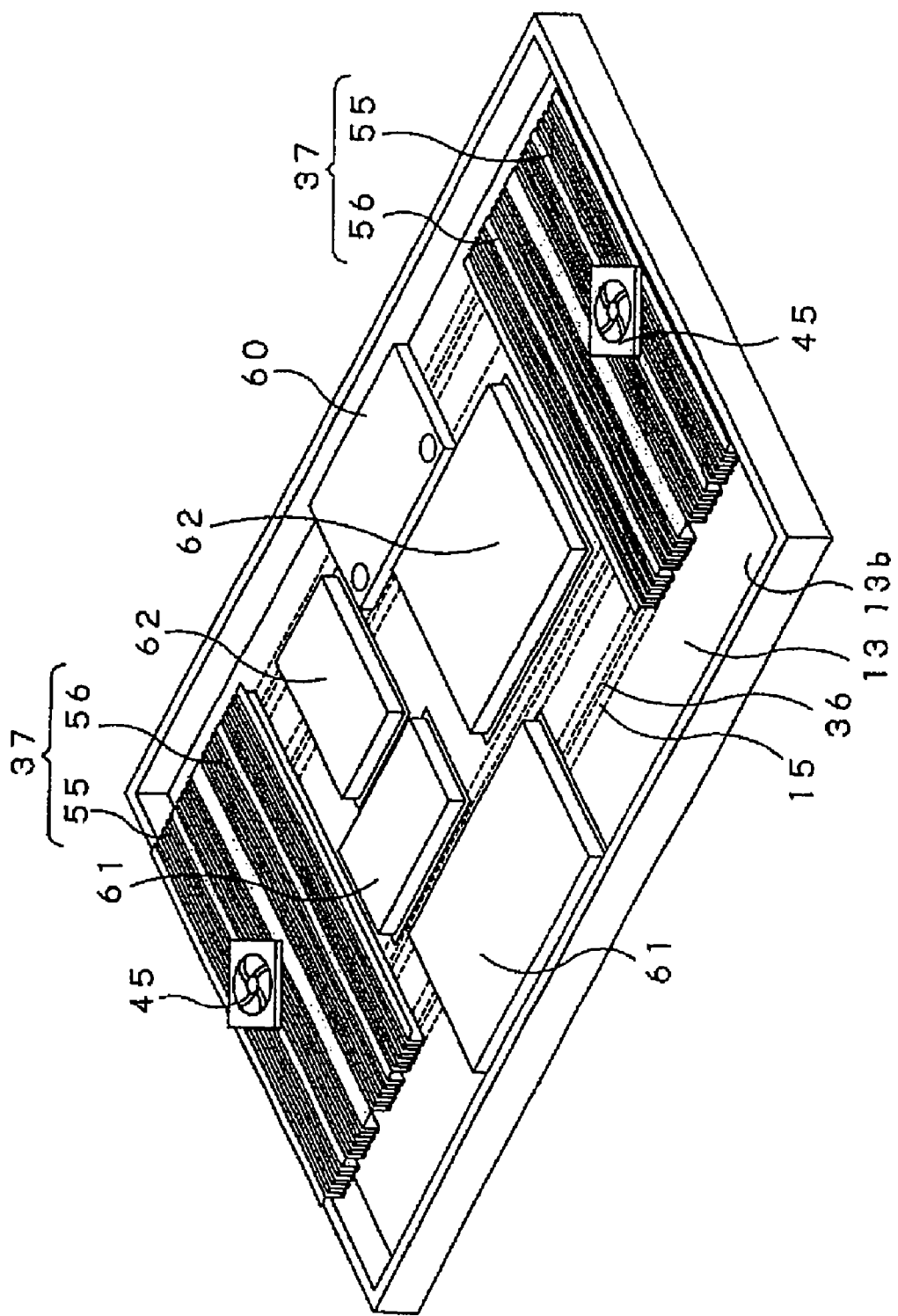
FIG. 11 is a perspective view showing another example of the back surface side of the transmissive liquid crystal display unit.

The radiation amount characteristics of the heat sink 37 are changed depending on the screen size of the liquid crystal panel 8. The radiation amount characteristics of the heat sink 37 are defined by the shape or the size of the surface area of the fin 47, and a plurality of heat sinks 37 having different specifications need to be prepared depending on the screen size. For example, assuming that the standard screen size of the liquid crystal panel 8 is set to 40 inches, a pair of left and right heat sinks 37, 37 are disposed with respect to the back panel 13, as shown in FIG. 7. When the size of the liquid crystal panel 8 exceeds 40 inches, a back panel 13 having the corresponding size is used and a pair of left and right heat sinks 37, 37 are disposed with respect to the back panel 13. In this case, however, each heat sink 37 is constituted by the first and second heat sinks 55 and 56, as shown in FIG. 11.

The heat sink 37 is formed by an aluminum material and the like as described above. Thus, it can be considered that cutout work is applied to cut the material in a predetermined size to achieve parts sharing. However, the heat sink 37 has a complicated cross-section and a length of several ten centimeters, so that it is very difficult to cut out the material into a piece having a predetermined length and width, deteriorating yield and processing efficiency.

Figure 10:
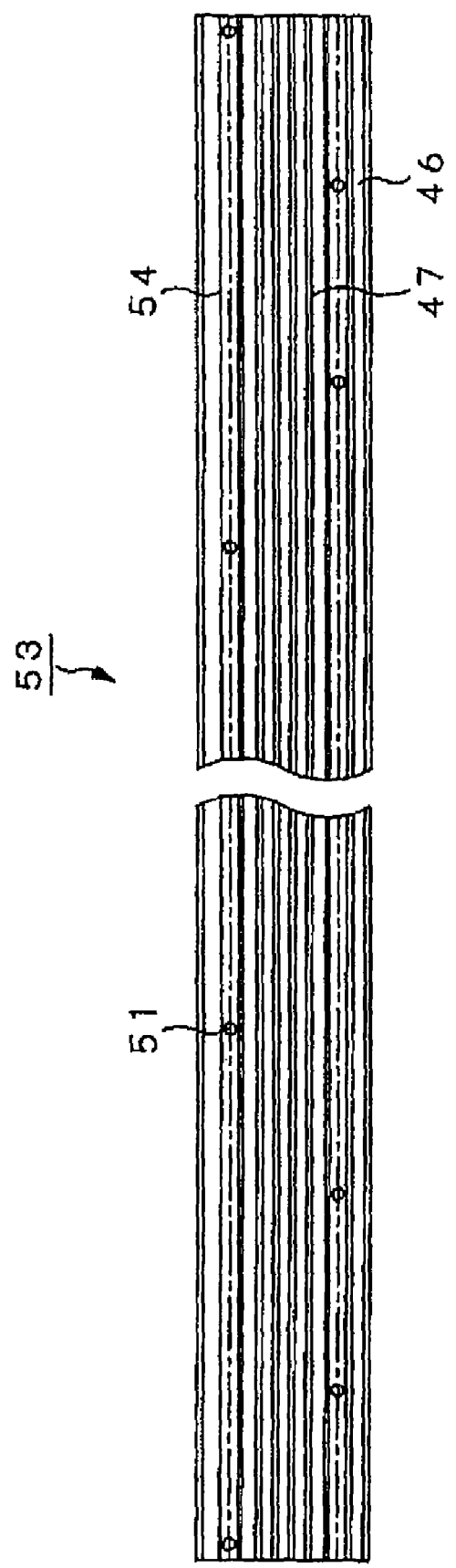
FIG. 10 is a plan view showing a shared heat sink material.

A TV set having a large-sized display screen uses a liquid crystal panel of about 40 inches, so that the heat generation amount is extremely high. In light of this, the heat sink 37 is obtained as follows: a shared heat sink material 53 as shown in FIG. 10 having a width W and length L is prepared, the shared heat sink material 53 is cut out into a piece having a predetermined length to form the first heat sink 55 and the second heat sink 56 for covering shortfall of a desired radiation amount corresponding to the screen size is combined with the first heat sink 55. The shared heat sink material 53, which is produced with a liquid crystal panel for e.g., 40 inches set to a reference, is formed to have a width W of 140 mm which is sufficient to ensure a required radiation amount corresponding to 40 inches reference screen size and a length L up to the maximum screen size of 55 inches.

As described above, the shared heat sink material 53 is prepared, the shared heat sink material 53 is cut out into a piece having a predetermined length to form the first heat sink 55, the second heat sink 56 for covering shortfall of a desired radiation amount corresponding to the screen size is combined with the first heat sink 55 and thereby the heat sink 37 is obtained. As shown in FIG. 10, in the shared heat sink material 53, a plurality of rows of fins 47 integrally formed, standing upright, on the base 46 and combination portion 54 is integrally formed along one side edge of the base 46 throughout the entire length thereof. Further, a plurality of mounting holes 51 are formed in the base 46 at predetermined intervals. Further, although not shown, a mounting portion with respect to the cooling fan 45 is formed in the shared heat sink material 53.

In accordance with the screen size, the shared heat sink material 53 is cut out in the with direction at a predetermined position with one end surface in the length direction set as a reference point, and thereby the first heat sink 55 is obtained. As described above, the first heat sink 55 is effectively and accurately formed by cutting the shared heat sink material 53 in the width direction.

Figure 12A:
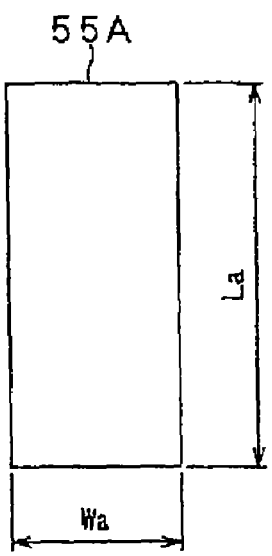
FIGS. 12A to 12D each show a plan view showing a combined state of the heat sinks.

In the case where a 40 inch liquid crystal panel 8 is used, the heat sink 37 is constituted by one first heat sink 55A (in practice, a pair of left and right first heat sinks 55A are provided) as shown in FIG. 12A obtained by cutting out the shared heat sink material 53 into a piece having a predetermined length La. Specifically, the first heat sink 55A is formed to have a length La of 410 mm and a width Wa of 140 mm.

Figure 12B:
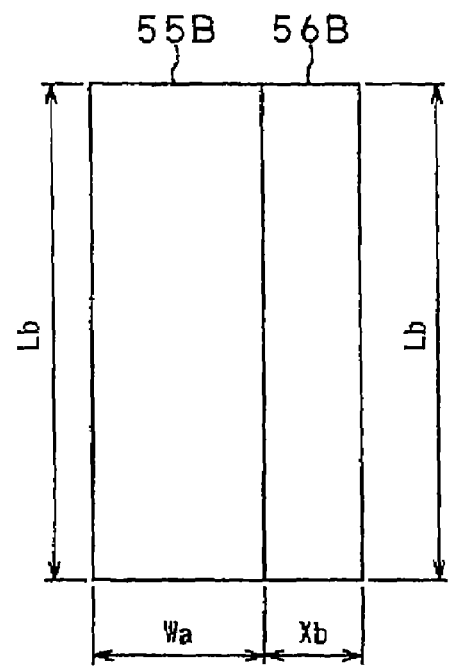

In the case where a 42 inch liquid crystal panel 8 is used, the heat sink 37 is constituted by a first heat sink 55B (in practice, a pair of left and right first heat sinks 55B are provided) as shown in FIG. 12B obtained by cutting out the shared heat sink material 53 into a piece having a predetermined length Lb and a second heat sink 56B for covering shortfall of a radiation amount. Specifically, the first heat sink 55B is formed to have a length Lb of 430 mm and a width Wa of 140 mm. The second heat sink 56B is formed to have a width Xb of 40 mm and a length Lb of 430 mm which is equal to the length Lb of the first heat sink 55B.

Figure 12C:
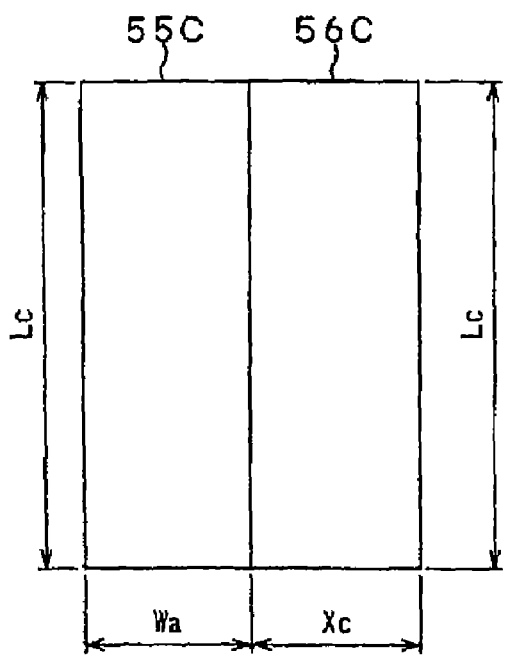

In the case where a 46 inch liquid crystal panel 8 is used, the heat sink 37 is constituted by a first heat sink 55C (in practice, a pair of left and right first heat sinks 55C are provided) as shown in FIG. 12C obtained by cutting out the shared heat sink material 53 into a piece having a predetermined length Lc and a second heat sink 56C for covering shortfall of a radiation amount. Specifically, the first heat sink 55C is formed to have a length Lc of 470 mm and a width Wa of 140 mm. The second heat sink 56C is formed to have a width Xc of about 53 to 54 mm and a length Lc of 470 mm which is equal to the length Lc of the first heat sink 55C.

Figure 12D:
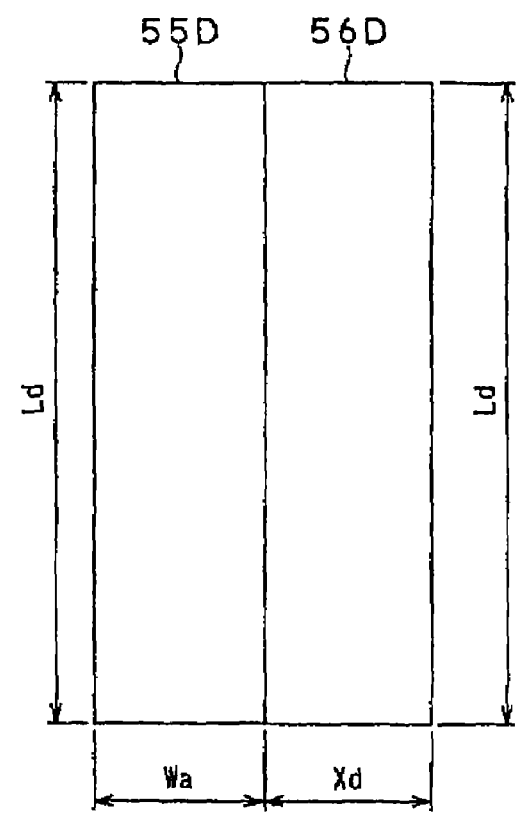

In the case where a 55 inch liquid crystal panel 8 is used, the heat sink 37 is constituted by a first heat sink 55D (in practice, a pair of left and right first heat sinks 55D are provided) as shown in FIG. 12D obtained by cutting out the shared heat sink material 53 into a piece having a predetermined length Ld and a second heat sink 56D for covering shortfall of a radiation amount. Specifically, the first heat sink 55D is formed to have a length Ld of 560 mm and a width Wa of 140 mm. The second heat sink 56D is formed to have a width Xd of about 140 mm and a length Ld of 560 mm which is equal to the length Ld of the first heat sink 55D. Thus, the heat sink 37 is constituted by combining the first and second heat sinks 55D and 56D having the same shape.

As described above, a 40 inch liquid crystal panel 8 is used as a reference display panel and a shared heat sink material 53 having a long length and a width W conforming to the reference display panel. In the case where the liquid crystal panel having a larger size than that of the reference display panel, the heat sink 37 is constituted by combining a first heat sink 55 obtained by cutting the shared heat sink material 53 into a piece having a predetermined length conforming to the size of the reference display panel and a second heat sink 56 for covering shortfall of a radiation amount. As a result, parts sharing can be achieved with respect to the liquid crystal display unit 1 using various specifications of liquid crystal panels. Further, an optimum heat sink 37 can be obtained depending on the size of the liquid crystal panel, thereby realizing effective heat radiation.

In the liquid crystal display unit 1 according to the present invention, the configuration of the heat sink 37 is not limited to that obtained by combining the first and second heat sinks 55 and 56 which have the abovementioned dimensions selected in correspondence with the respective screen specifications, but radiation characteristics of the shared heat sink material 53 constituting the first heat sink 55 is determined by the size or the number of the fins 47 and the length L or width W of the shared heat sink material 53 is changed based on the determined radiation characteristics. Further, in order to establish the sharing of mounting structure with respect to the back panel 13 to thereby achieve uniform radiation effect, it is preferable that the second heat sink 56 is integrated with the first heat sink 55 through the combination portion 54 having the same length as the first heat sink 55. Further, it is preferable that the cooling fan 45 is mounted only to the first heat sink 55 side. In this case, the structure of the second heat sink 56 is simplified to reduce cost.

Although the above embodiment has been described taking the transmissive type liquid crystal display unit 1 of a TV set using a large-sized liquid crystal panel of 40 inches or more as an example, the present invention can be applied not only to various types of large-sized liquid crystal display units but also to display units using a middle-sized liquid crystal panel.

The present invention is not limited to the above embodiment described using the accompanied drawings, but various modifications, substitutions, or equivalents will readily occur to persons in the art without deviating from the appended claims and the scope of subject matters thereof.

The invention claimed is:

1. A heat radiator provided in a transmissive display unit in which a plurality of rows of light emitting arrays constituted by arranging a plurality of light emitting units including a plurality of light emitting diodes mounted on a wiring substrate are arranged on a back surface portion of a transmissive display panel, and for illuminating light emitted from the light emitting diodes to the display panel, comprising:

a radiation plate which is formed by a metal material having heat conductance and which is configured to support each wiring substrate on a first surface thereof to constitute the light emitting unit;

a back panel which is formed by a metal material having heat conductance and on a first surface of which the radiation plate is mounted by fixing a second surface of the radiation plate; and a heat sink which is formed by a metal material having heat conductance, which includes a base and a plurality of fins integrally formed at predetermined intervals on a first surface of the base, which is mounted to a second surface of the back panel using a second surface of the base as a mounting surface, and which radiates heat from each of the fins by conducting heat generated by a lighting operation of the light emitting diodes according to heat conduction means, wherein the heat sink is disposed facing to a portion of the radiation plate through the back panel to constitute an overlap portion, where a plurality of mounting holes are formed in each of the radiation plate, back panel, and heat sink as to communicate with each other, and the radiation plate and heat sink are integrated with each other through the back panel by fixing members inserted in the mounting holes, and wherein the back panel has a thickness which is smaller than the thickness of the radiation plate and is smaller than the thickness of the base of the heat sink.

2. A display unit comprising:

a transmissive display panel which performs display using illuminating light supplied from a back surface side thereof;

a backlight unit which includes a plurality of rows of light emitting arrays constituted by arranging, on the back surface side of the display panel, a plurality of light emitting blocks including a plurality of light emitting diodes, a wiring substrate on which the light emitting diodes are mounted, and a plurality of radiation plates each formed by a metal plate having heat conductance which supports each wiring substrate on a first main surface thereof, and which is configured to supply the illuminating light emitted from the light emitting diodes to the display panel;

an optical conversion light guide section which is disposed between the display panel and the backlight unit and which is configured to apply predetermined optical conversion processing and uniformity processing to the illuminating light to illuminate the display panel;

a back panel which is formed by a metal material having heat conductance and on a first surface of which a second surface of each radiation plate of the light emitting blocks is fixed so as to face to the display panel; and a heat sink which is formed by a metal material having heat conductance, which includes a base and a plurality of fins integrally formed at predetermined intervals on a first main surface of the base, which is mounted to a second surface of the back panel using a second surface of the base as a mounting surface, and which radiates heat generated by a lighting operation of the light emitting diodes of the backlight unit by conducting the heat from each of the fins through each radiation plate, wherein the heat sink is disposed facing to a portion of the radiation plate through the back panel to constitute an overlap portion, where a plurality of mounting holes are formed in each of the radiation plate, back panel, and heat sink as to communicate with each other, and the radiation plate and heat sink are integrated with each other through the back panel by fixing members inserted in the mounting holes, and wherein the back panel has a thickness which is smaller than the thickness of the radiation plate and is smaller than the thickness of the base of the heat sink.

* * * * *